US011869791B2

(12) United States Patent
Takagi et al.

(10) Patent No.: US 11,869,791 B2
(45) Date of Patent: Jan. 9, 2024

(54) VACUUM PROCESSING APPARATUS

(71) Applicant: ULVAC, INC., Chigasaki (JP)

(72) Inventors: Dai Takagi, Chigasaki (JP); Yuu Mizushima, Chigasaki (JP); Toshiyuki Koizumi, Chigasaki (JP)

(73) Assignee: Ulvac, Inc., Chigasaki (JP)

( * ) Notice: Subject to any disclaimer, the term of this patent is extended or adjusted under 35 U.S.C. 154(b) by 231 days.

(21) Appl. No.: 17/311,872

(22) PCT Filed: Sep. 2, 2019

(86) PCT No.: PCT/JP2019/034451
§ 371 (c)(1),
(2) Date: Jun. 8, 2021

(87) PCT Pub. No.: WO2020/144891
PCT Pub. Date: Jul. 16, 2020

(65) Prior Publication Data
US 2022/0018014 A1     Jan. 20, 2022

(30) Foreign Application Priority Data

Jan. 8, 2019   (JP) .................................. 2019-001025

(51) Int. Cl.
    *C23C 14/50*        (2006.01)
    *C23C 14/56*        (2006.01)
    *H01L 21/677*      (2006.01)

(52) U.S. Cl.
    CPC .......... *H01L 21/6776* (2013.01); *C23C 14/50* (2013.01); *C23C 14/56* (2013.01); *H01L 21/67715* (2013.01); *H01L 21/677* (2013.01)

(58) Field of Classification Search
    CPC .......... H01L 21/67715; H01L 21/677–67703; H01L 21/67706; H01L 21/68728; C23C 14/56; C23C 16/54; C23C 14/50
See application file for complete search history.

(56) References Cited

U.S. PATENT DOCUMENTS

| 4,261,808 A * | 4/1981 | Walter .................. C23C 14/568 |
| | | 118/733 |
| 5,086,279 A | 2/1992 | Wochnowski et al. |

(Continued)

FOREIGN PATENT DOCUMENTS

| CN | 102171116 A | 8/2011 |
| CN | 103648711 A | 3/2014 |

(Continued)

OTHER PUBLICATIONS

Office Action dated Mar. 3, 2022 in Chinese Application No. 201980024156.4.

(Continued)

*Primary Examiner* — Aiden Lee
(74) *Attorney, Agent, or Firm* — Saliwanchik, Lloyd & Eisenschenk

(57) ABSTRACT

The present invention provides a technology capable of inhibiting, in a vacuum processing apparatus that conveys a plurality of substrate holders along a conveying path formed to have a projected shape on a vertical surface, the projected shape being a continuous ring shape, dust from being generated during conveyance of a substrate holder. The present invention includes, in a vacuum chamber 2, an anti-sag member 35 assembled to a first drive unit 36 provided on an outer side with respect to a conveying direction of the conveying path, the vacuum chamber 2 including a conveying path formed to have a projected shape on the vertical surface, the projected shape being a continuous ring shape, a single vacuum atmosphere being formed in the vacuum chamber 2. A travel roller 54 of the anti-sag member 35 travels while being guided and supported by a guide unit 17 that is provided below a return-path-side conveying portion 33c positioned on a lower side of a substrate holder conveying mechanism 3 and extends in a second conveying direction P2, and the first drive part 36 is (Continued)

configured to come into contact with a first driven unit 12 of a substrate holder 11 and drive the substrate holder 11 along the conveying path in the second conveying direction P2.

5 Claims, 23 Drawing Sheets

(56) References Cited

U.S. PATENT DOCUMENTS

| | | | |
|---|---|---|---|
| 2008/0233283 A1* | 9/2008 | Choi | H01L 21/67748 427/226 |
| 2010/0143079 A1 | 6/2010 | Iijima | |
| 2011/0206485 A1 | 8/2011 | Clerkx et al. | |
| 2012/0288347 A1 | 11/2012 | Minami | |
| 2013/0115373 A1* | 5/2013 | Kim | C23C 14/50 118/729 |
| 2014/0131170 A1 | 5/2014 | Ookubo | |
| 2015/0368793 A1 | 12/2015 | von der Waydbrink et al. | |
| 2018/0370733 A1 | 12/2018 | Nakao | |
| 2020/0002807 A1 | 1/2020 | Matsuzaki et al. | |

FOREIGN PATENT DOCUMENTS

| | | |
|---|---|---|
| CN | 108368605 A | 8/2018 |
| CN | 109082629 A | 12/2018 |
| DE | 10 2014 114 575 A1 | 12/2015 |
| JP | 1-312072 A | 12/1989 |
| JP | 2007-31821 A | 2/2007 |
| JP | 2009-114502 A | 5/2009 |
| JP | 2011-104757 A | 6/2011 |
| WO | WO-2017/104826 A1 | 6/2017 |
| WO | WO-2018/230592 A1 | 12/2018 |

OTHER PUBLICATIONS

Office Action dated Sep. 23, 2022 in Chinese Application No. 201980024156.4.

International Search Report dated Nov. 26, 2019 in International Application No. PCT/JP2019/034451.

* cited by examiner

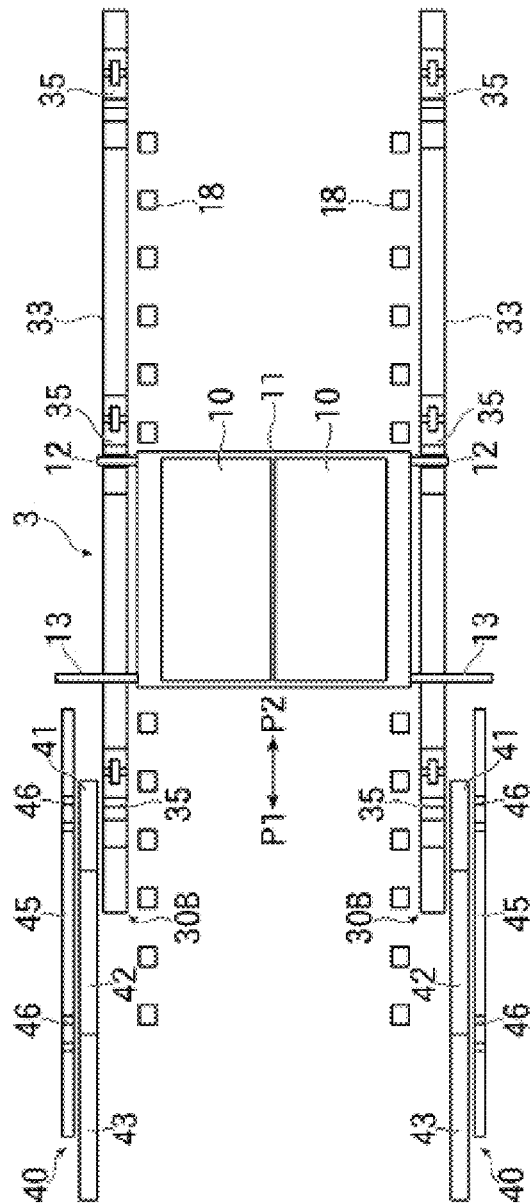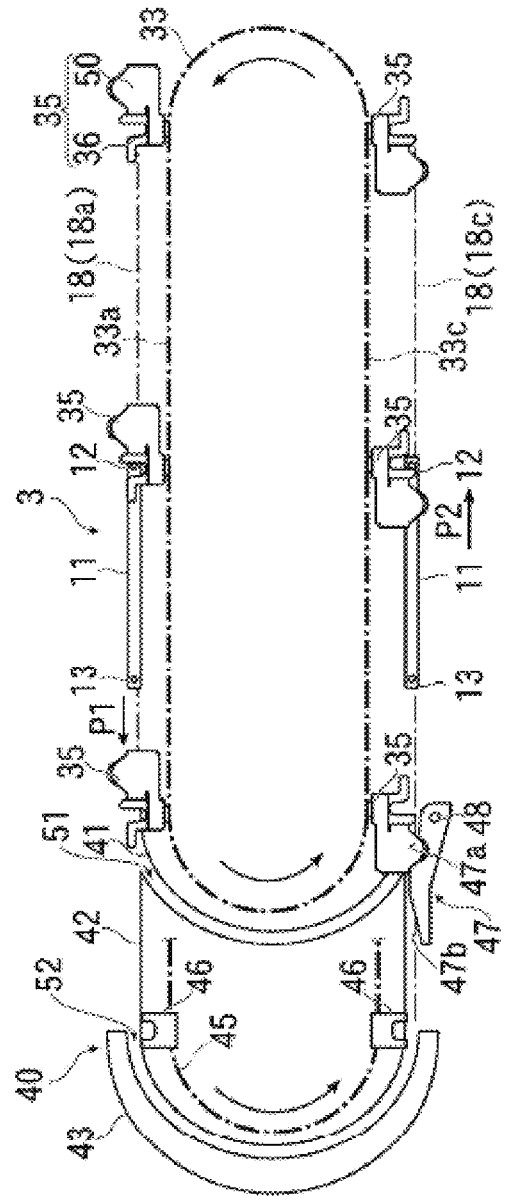
FIG.2A
FIG.2B

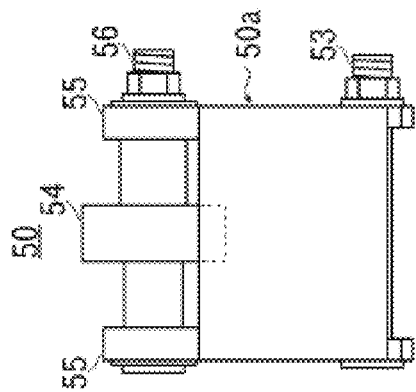
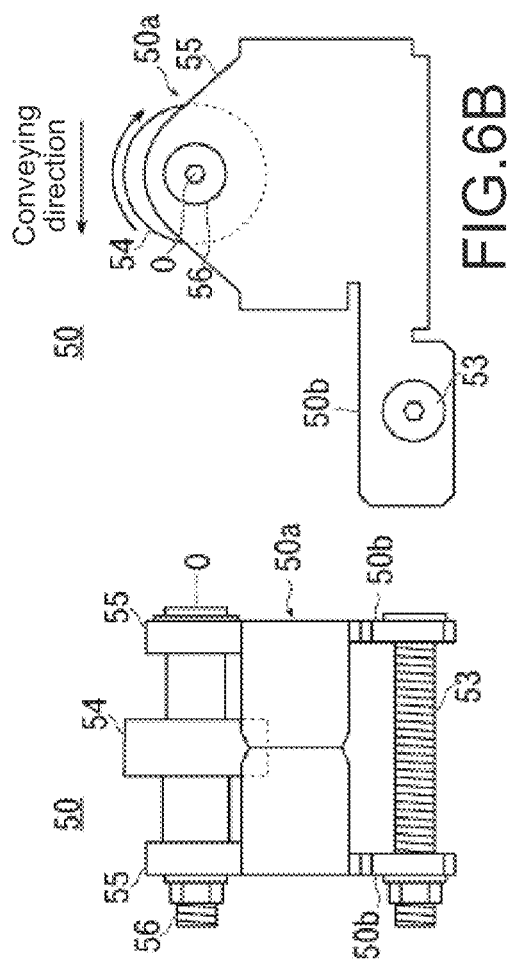
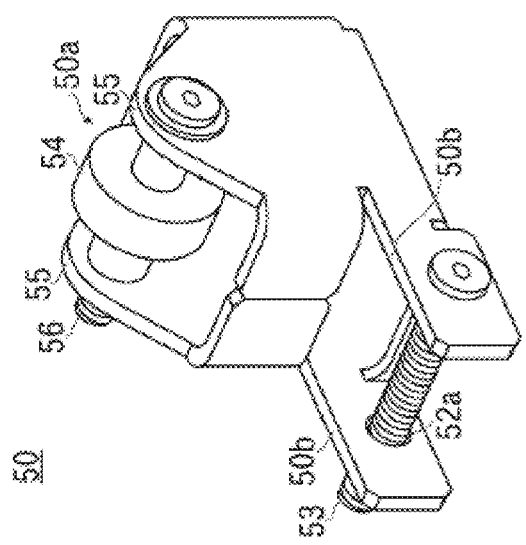
FIG.6A  FIG.6B  FIG.6C  FIG.6D

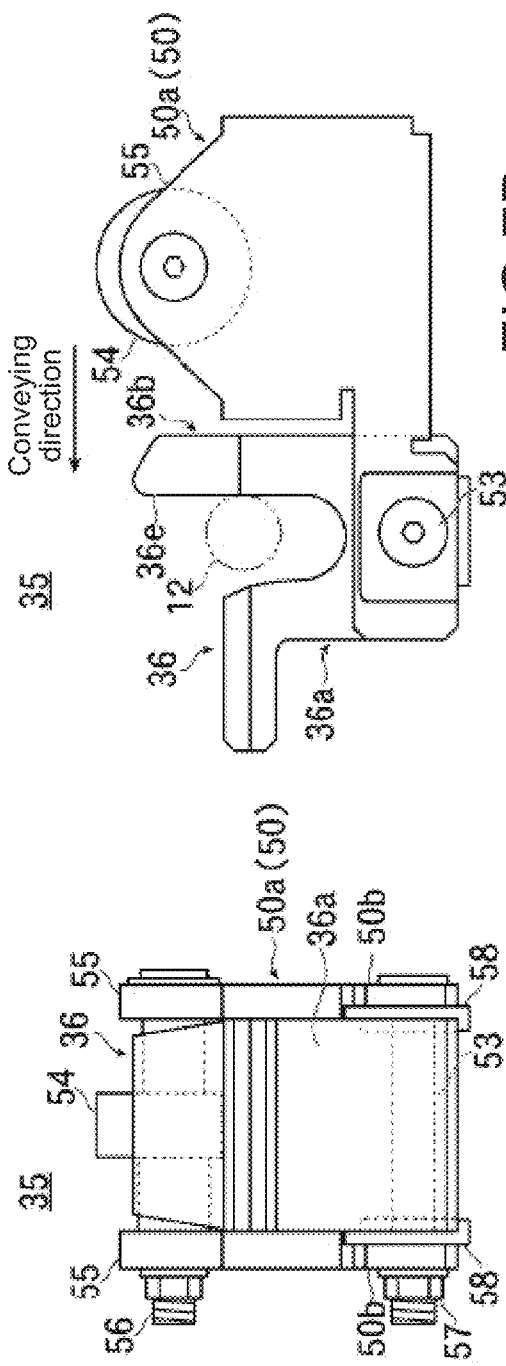
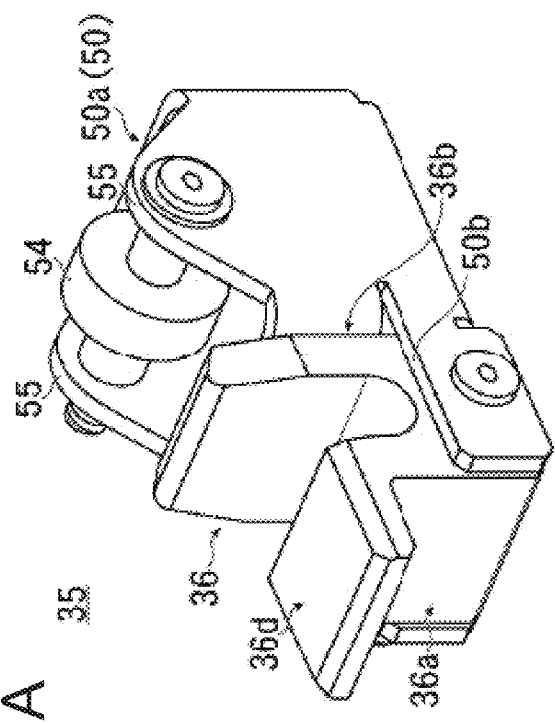
FIG.7A
FIG.7B
FIG.7C

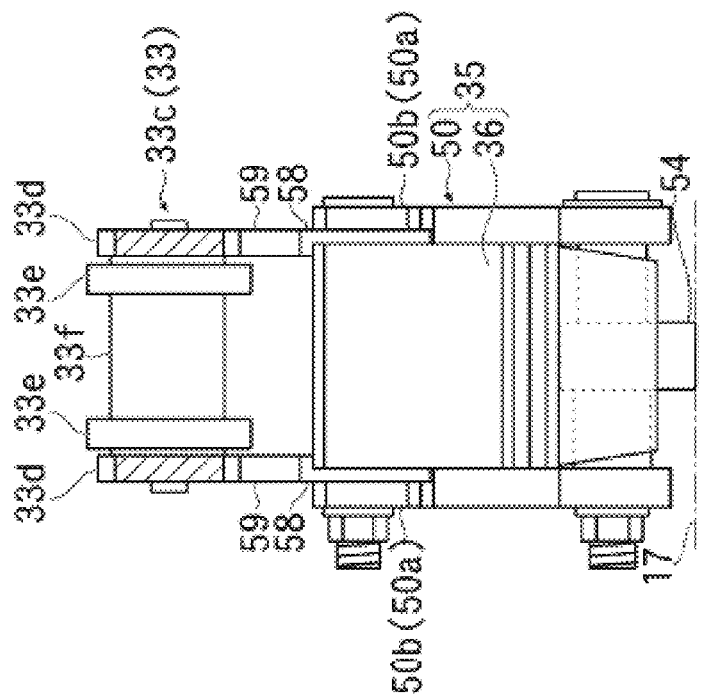
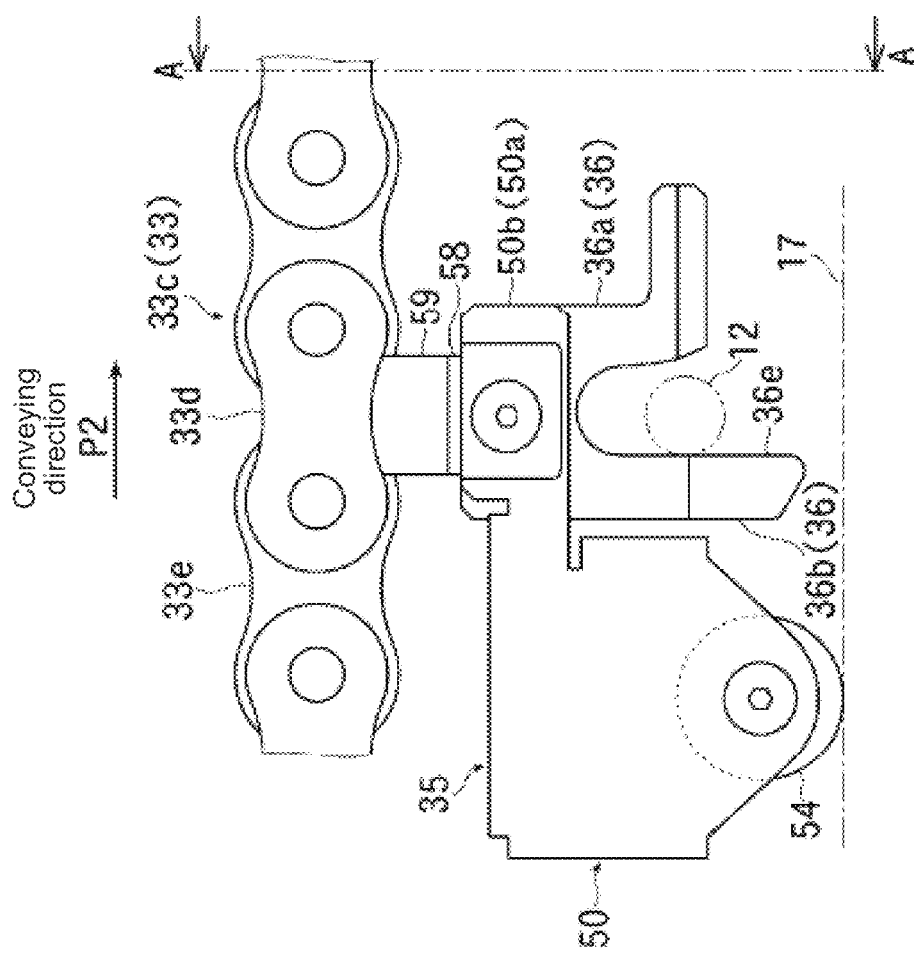
FIG.8A
FIG.8B

VACUUM PROCESSING APPARATUS

CROSS-REFERENCE TO RELATED APPLICATIONS

This application is the U.S. national stage application of International Patent Application No. PCT/JP2019/034451, filed Sep. 2, 2019, which claims the benefit under 35 U.S.C. § 119 of Japanese Application No. 2019-001025, filed Jan. 8, 2019, the disclosures of each of which are incorporated herein by reference in their entirety.

TECHNICAL FIELD

The present invention relates to a technology of a vacuum processing apparatus that performs vacuum processing such as through deposition on both surfaces of a substrate held by a substrate holder in a vacuum.

BACKGROUND ART

Conventionally, a vacuum processing apparatus in which a plurality of substrates to be processed is placed on a substrate holder such as a tray and processing such as through deposition is performed thereon has been known. Recently, a vacuum processing apparatus including an annular conveying path has also been proposed.

FIG. 22 is a schematic configuration diagram showing an entire vacuum processing apparatus according to an existing technology.

As shown in FIG. 22, this vacuum processing apparatus 101 includes a vacuum chamber 102 connected to a vacuum exhaust device 101a, a single vacuum atmosphere being formed in the vacuum chamber 102.

A substrate holder conveying mechanism 103 that continuously conveys a plurality of substrate holders 111 each holding a substrate (not shown) along a conveying path is provided inside the vacuum chamber 102.

Here, in the substrate holder conveying mechanism 103, structure bodies in which a series of conveyance drive members 133 is bridged over a pair of drive wheels 131 and 132 disposed at a predetermined distance while the rotation axes thereof are in parallel with each other are disposed in parallel with each other at a predetermined distance, thereby forming a conveying path that has a continuous ring shape with respect to the vertical surface.

The substrate holder conveying mechanism 103 is provided with a substrate holder introduction portion 130A that introduces the substrate holder 111, a conveyance turnaround portion 130B that turns and conveys the substrate holder 111, and a substrate holder discharge portion 130C that discharges the substrate holder 111.

In the vacuum chamber 102, a first processing region 104 is provided above the substrate holder conveying mechanism 103, and a second processing region 105 is provided below the substrate holder conveying mechanism 103. An outbound-side conveying portion 133a on the upper side of the conveyance drive member 133 is configured to pass through the first processing region 104 linearly along a first conveying direction P1 and a return-path-side conveying portion 133c on the lower side is configured to pass through the second processing region 105 linearly along a second conveying direction P2.

Then, a direction change mechanism 140 is provided in the vicinity of the conveyance turnaround portion 130B of the substrate holder conveying mechanism 103, the direction change mechanism 140 turning the substrate holder 111 from the first conveying direction P1 to the second conveying direction P2 while maintaining the vertical relationship.

Meanwhile, a substrate carry-in/carry-out mechanism 106 is provided in the vacuum chamber 102 at a position adjacent to the drive wheel 131 of the substrate holder conveying mechanism 103.

This substrate carry-in/carry-out mechanism 106 includes a support portion 162 provided at a tip (upper end) portion of a drive rod 161 driven by a lifting mechanism 160 in the vertical (up-and-down) direction, and supports the above-mentioned substrate holder 111 on a conveying robot 164 provided on this support portion 162 to cause the above-mentioned substrate holder 111 to move in the vertical (up-and-down) direction.

Then, this conveying robot 164 is used to deliver the substrate holder 111 from the substrate carry-in/carry-out mechanism 106 to the substrate holder introduction portion 130A of the substrate holder conveying mechanism 103, and to receive, by the substrate carry-in/carry-out mechanism 106, the substrate holder 111 discharged from the substrate holder discharge portion 130C of the substrate holder conveying mechanism 103.

FIG. 23 is a schematic configuration diagram showing an existing substrate holder conveying mechanism.

As shown in FIG. 23, the pair of conveyance drive members 133 of the substrate holder conveying mechanism 103 is provided with a plurality of first drive units 136 at predetermined intervals in such a way that the plurality of first drive units 136 projects toward the outer side with respect to the conveying direction of the annular conveyance drive member 133 (hereinafter, referred to as "conveying-direction-outer side").

The first drive unit 136 is formed in, for example, a J-hook shape (a shape in which a groove portion is formed such that the height of a protruding portion 136b on the upstream side of the conveying direction is higher than the height of a protruding portion 136a on the downstream side of the conveying direction), and is configured to be in contact with a first driven unit 112 of the substrate holder 111 supported by a substrate holder supporting mechanism 118 to drive the substrate holder 111 in the first or second conveying direction P1 or P2.

A linear guide unit 117 that inhibits the return-path-side conveying portion 133c from sagging and guides the return-path-side conveying portion 133c is provided below the return-path-side conveying portion 133c of this conveyance drive member 133, and the tip portion (lower end portion) of the protruding portion 136b of the first drive unit 136 on the upstream side of the conveying direction moves while being in contact with the guide unit 117, thereby inhibiting the return-path-side conveying portion 133c from sagging.

However, in the existing technology, there has been a problem that the tip portion of the protruding portion 136b of the first drive unit 136 on the upstream side of the conveying direction is in contact with the guide unit 117 to generate dust, which affects the vacuum processing.

In addition, there has been a demand to shorten the time required to deliver the substrate holder 111 discharged from the substrate holder discharge portion 130C of the substrate holder conveying mechanism 103 to the substrate carry-in/carry-out mechanism 106.

CITATION LIST

Patent Literature

Patent Literature 1: Japanese Patent Application Laid-open No. 2007-031821

DISCLOSURE OF INVENTION

Technical Problem

The present invention has been made in view of the above-mentioned problem of the existing technology, and it is an object of the present invention to provide a technology capable of inhibiting, in a vacuum processing apparatus that conveys a plurality of substrate holders along a conveying path formed to have a projected shape on a vertical surface, the projected shape being a continuous ring shape, dust from being generated during conveyance of a substrate holder.

Further, another object of the present invention is to provide a technology capable of shortening the time required to deliver a substrate holder discharged from a substrate holder discharge portion of a substrate holder conveying mechanism to a substrate carry-in/carry-out mechanism.

Solution to Problem

The preset invention that has been made in order to achieve the above-mentioned object is a vacuum processing apparatus including: a vacuum chamber, a single vacuum atmosphere being formed in the vacuum chamber;
first and second processing regions provided in the vacuum chamber, predetermined vacuum processing being performed on a substrate held by a substrate holder in the first and second processing regions;
a conveying path formed in such a way that a projected shape on a vertical surface is a continuous ring shape, the substrate holder being conveyed on the conveying path;
a substrate holder conveying mechanism that conveys a plurality of the substrate holders including first and second driven units along the conveying path, in which
the conveying path includes a first conveying portion for conveying the introduced substrate holder in a first conveying direction along the conveying path while horizontalizing the introduced substrate holder, a second conveying portion for conveying the substrate holder along the conveying path in a second conveying direction opposite to the first conveying direction while horizontalizing the substrate holder and for discharging the substrate holder, and a conveyance turnaround portion for turning and conveying the substrate holder from the first conveying portion to the second conveying portion, the first conveying portion being configured to pass through one of the first and second processing regions, the second conveying portion being configured to pass through the other of the first and second processing regions,
the substrate holder conveying mechanism includes a plurality of first drive units on an outer side with respect to a conveying direction of the conveying path, the plurality of first drive units being in contact with a first driven unit of the substrate holder to drive the substrate holder along the conveying path,
a direction change mechanism including a plurality of second drive units and first and second direction change paths is provided in a vicinity of the conveyance turnaround portion of the conveying path, the plurality of second drive units being in contact with the second driven unit of the substrate holder to drive the substrate holder in the first and second conveying directions, the first and second direction change paths being for respectively guiding and conveying the first and second driven units of the substrate holder so as to turn the substrate holder from the first conveying direction to the second conveying direction,
the substrate holder is delivered from the first conveying portion of the conveying path to the second conveying portion of the conveying path while maintaining a vertical relationship of the substrate holder by operating the first drive unit of the substrate holder conveying mechanism and the second drive unit of the direction change mechanism in synchronization with each other and guiding and conveying the first and second driven units of the substrate holder along the first and second direction change paths of the direction change mechanism,
an anti-sag member that is configured to be assembled to the first drive unit of the substrate holder conveying mechanism, includes a travel roller in a part on an outer side with respect to the conveying direction, the travel roller being rotatable about a rotation axis extending in a direction perpendicular to the conveying direction, and inhibits a conveyance drive member constituting the second conveying portion of the conveying path from sagging is provided,
a guide unit is provided below the second conveying portion of the conveying path located on a lower side of the substrate holder conveying mechanism, the guide unit extending in the second conveying direction, and
the anti-sag member is configured so that the travel roller travels along the second conveying portion of the conveying path while the travel roller is guided and supported by the guide unit, and the first drive unit of the substrate holder conveying mechanism is in contact with the first driven unit of the substrate holder to drive the substrate holder along the conveying path in the second conveying direction.

The present invention is a vacuum processing apparatus, in which the conveyance drive member is a conveyor chain.

The present invention is a vacuum processing apparatus, in which a drive surface is provided on the first drive unit of the anti-sag member, the drive surface extending downward and being in contact with the first driven unit of the substrate holder to drive the first driven unit in the conveying direction, and an upper inclined portion is provided in the guide unit, the upper inclined portion being formed to extend obliquely upward toward the second conveying direction.

The present invention is a vacuum processing apparatus, in which
deposition is performed in a vacuum in the first and second processing region.

The present invention is a vacuum processing apparatus, in which
the substrate holder is configured to hold a plurality of substrates to be deposited side by side in a direction perpendicular to the first and second conveying directions.

Advantageous Effects of Invention

In the present invention, since in a vacuum chamber that includes a conveying path formed so that a projected shape on a vertical surface is a continuous ring shape, a single vacuum atmosphere being formed in the vacuum chamber, a travel roller of an anti-sag member assembled to a first drive unit provided on an outer side with respect to a conveying direction of this conveying path travels along a guide unit that is provided below a second conveying portion located on the lower side of a substrate holder conveying mechanism and extends in a second conveying direction, and the first drive unit of the substrate holder conveying mechanism is in contact with a first driven unit of a substrate holder to drive the substrate holder along a conveying path in the second conveying direction, it is possible to suppress the generation of dust at the time of conveying the substrate holder as compared with the existing technology, while inhibiting a conveyance drive member (e.g., conveyor chain) constituting the second conveying portion of the conveying path from sagging.

In the present invention, in the case where the first drive unit of the anti-sag member is provided with a drive surface that extends downward and is in contact with a first driven unit of the substrate holder to drive the first driven unit in the conveying direction, and the guide unit is provided with an upper inclined portion that extends obliquely upward toward the second conveying direction, the anti-sag member is caused to move in the second conveying direction along the guide unit and passes through the upper inclined portion of the guide unit, and thus, the height positions of the travel roller of the anti-sag member with respect to the first driven unit of the substrate holder and the first drive unit gradually move upward, thereby making it possible to release the contact between the drive surface of the first drive unit and the first driven unit of the substrate holder in a straight part of the second conveying portion of the conveying path.

As a result, in accordance with the present invention, because the substrate holder can be caused to move in the second conveying direction along the second conveying portion without bringing the first drive unit of the anti-sag member and the second driven unit of the substrate holder into contact with each other, it is possible to shorten the moving distance during the operation of disconnecting the first drive unit of the anti-sag member from the first driven unit of the substrate holder as compared with the existing technology (e.g., in the case where the first drive unit of the anti-sag member is caused to move obliquely upward along an arc-shaped locus formed by a sprocket). This makes it possible to greatly advance the timing at which the substrate holder is discharged from the substrate holder conveying mechanism. At the same time, it is also possible to avoid the second driven unit of the substrate holder interfering with the drive surface of the first drive unit of the anti-sag member during the discharge.

Meanwhile, in the present invention, in the case where the substrate holder is configured to hold a plurality of substrates side by side in a direction perpendicular to the conveying direction, since the length of the substrate holder and the excess space associated therewith can be reduced, further space saving of the vacuum processing apparatus can be achieved, as compared with, for example, the existing technology in which a substrate holder that holds a plurality of substrates side by side in the conveying direction of the substrates is conveyed and processed.

BRIEF DESCRIPTION OF DRAWINGS

FIGS. 2A and 2B each show a basic configuration of a substrate holder conveying mechanism and a direction change mechanism according to this embodiment, FIG. 2A being a plan view, FIG. 2B being a front view.

FIGS. 6A-6D each show a traveling member used in this embodiment, FIG. 6A being a side surface diagram as viewed from the downstream side of the conveying direction, FIG. 6B being a front view, FIG. 6C being a side surface diagram as viewed from the upstream side of the conveying direction, FIG. 6D being a perspective view.

FIGS. 7A-7C each show a configuration of an anti-sag member used in this embodiment, FIG. 7A being a side surface diagram as viewed from the downstream side of the conveying direction, FIG. 7B being a front view, FIG. 7C being a perspective view.

FIGS. 8A and 8B each show an anti-sag member mounted to a conveyance drive member, FIG. 8A being a front view, FIG. 8B being a cross-sectional view taken along the line A-A in FIG. 8A.

MODE(S) FOR CARRYING OUT THE INVENTION

Hereinafter, an embodiment of the present invention will be described in detail with reference to the drawings.

Figure 1:
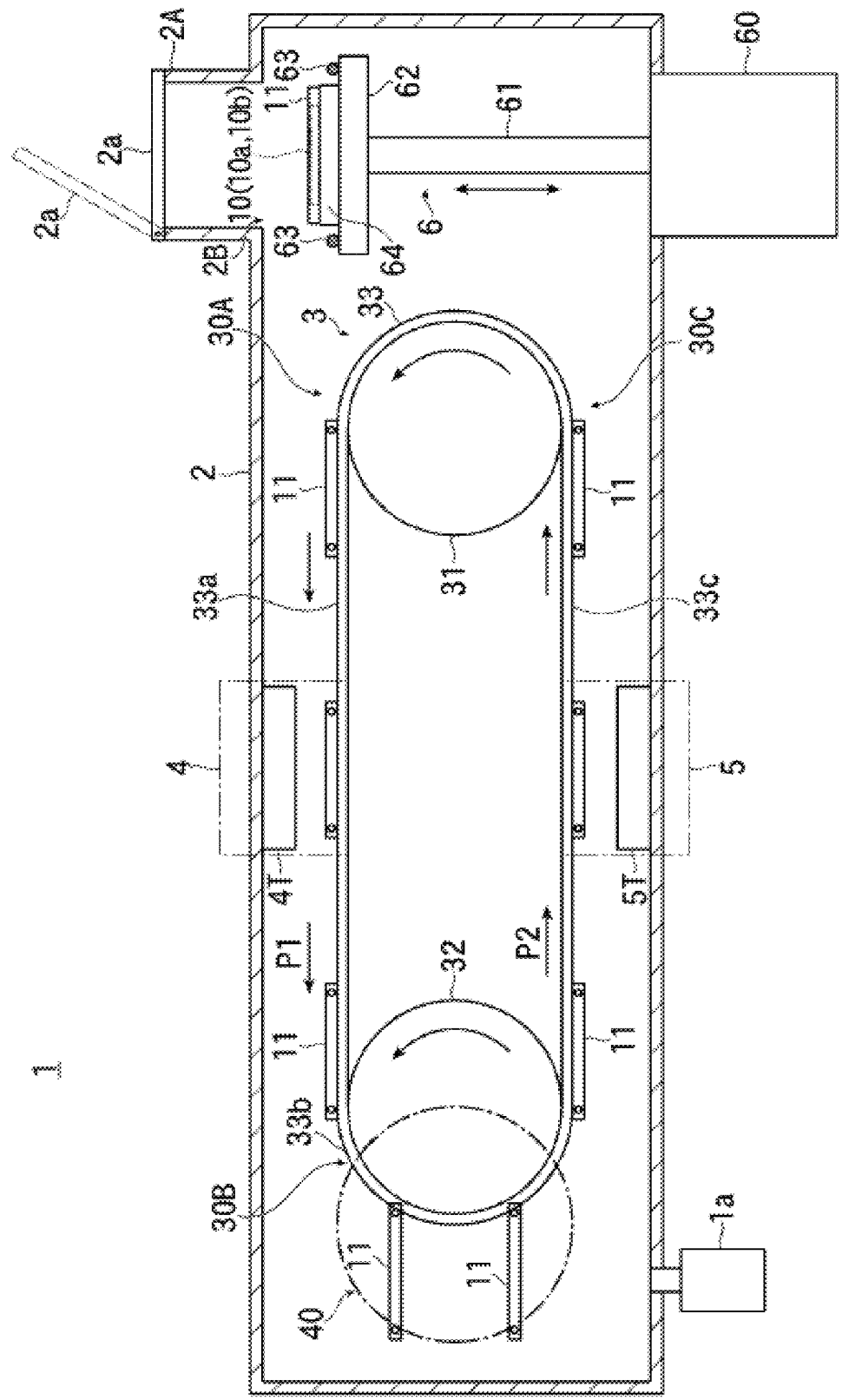
FIG. 1 is a schematic configuration diagram showing an entire vacuum processing apparatus according to an embodiment of the present invention.

FIG. 1 is a schematic configuration diagram showing an entire vacuum processing apparatus according to an embodiment of the present invention.

Further, FIGS. 2A and 2B each show a basic configuration of a substrate holder conveying mechanism and a direction change mechanism according to this embodiment, FIG. 2A being a plan view, FIG. 2B being a front view.

Figure 3A:
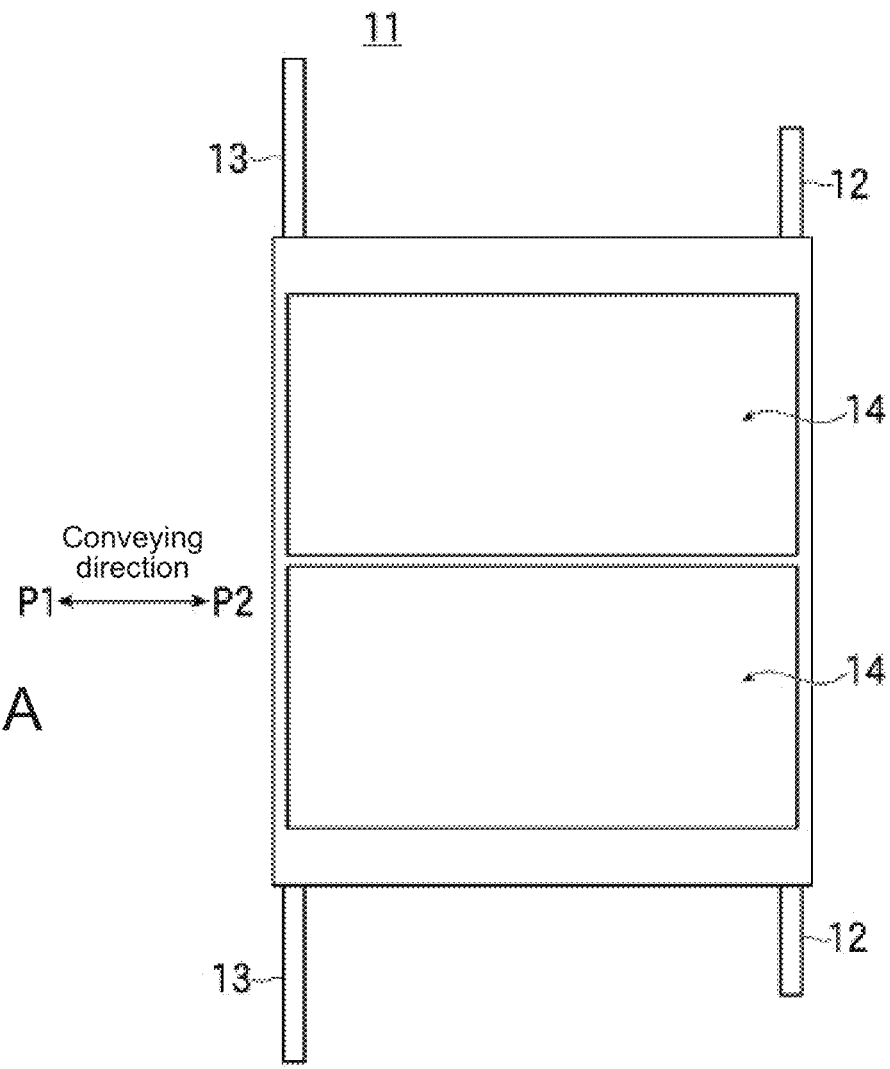
FIGS. 3A and 3B each show a configuration of a substrate holder used in this embodiment, FIG. 3A being a plan view, FIG. 3B being a front view.
Figure 3B:

Further, FIGS. 3A and 3B each show a configuration of a substrate holder used in this embodiment, FIG. 3A being a plan view, FIG. 3B being a front view.

Figure 4:
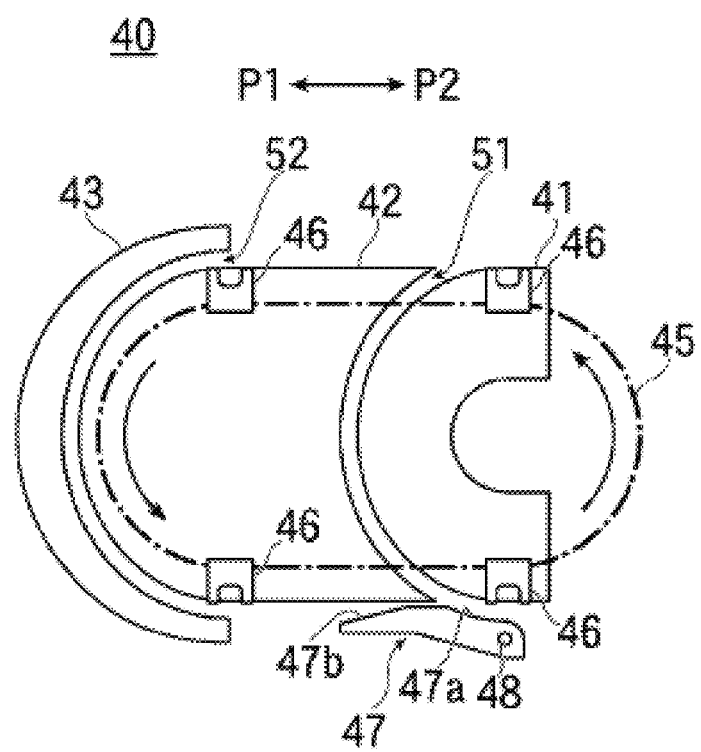
FIG. 4 is a front view showing a configuration of a direction change mechanism according to this embodiment.

Further, FIG. 4 is a front view showing a configuration of a direction change mechanism according to this embodiment.

As shown in FIG. 1, a vacuum processing apparatus 1 according to this embodiment includes a vacuum chamber 2 connected to a vacuum exhaust device 1a, a single vacuum atmosphere being formed in the vacuum exhaust device 1a.

Inside the vacuum chamber 2, a substrate holder conveying mechanism 3 that conveys a substrate holder 11, which will be described below, along a conveying path is provided.

The substrate holder conveying mechanism 3 is configured to continuously convey a plurality of substrate holders 11 each holding a substrate 10.

Here, the substrate holder conveying mechanism 3 includes, for example, first and second circular drive wheels 31 and 32 that include a sprocket or the like, have the same diameter, and operate by receiving rotational driving force from a drive mechanism (not shown), and these first and second drive wheels 31 and 32 are disposed at a predetermined distance while the respective rotation axes are parallelized.

Then, a series of conveyance drive members 33 including, for example, a conveyor chain is bridged over the first and second drive wheels 31 and 32.

Further, structure bodies in which the conveyance drive members 33 are bridged over the first and second drive wheels 31 and 32 are disposed in parallel at a predetermined distance (see FIG. 2A), and a conveying path having a continuous ring shape with respect to the vertical surface is formed by the pair of conveyance drive members 33.

In this embodiment, an outbound-side conveying portion (first conveying portion) 33a that moves from the first drive wheel 31 toward the second drive wheel 32 and conveys the substrate holder 11 in a first conveying direction P1 is formed in the upper part of the conveyance drive members 33 that constitutes a conveying path, the conveyance drive members 33 of the surrounding portions of the second drive wheel 32 form a turnaround portion 33b that turns the conveying direction of the substrate holder 11 to the opposite direction, and a return-path-side conveying portion (second conveying portion) 33c that moves from the second drive wheel 32 toward the first drive wheel 31 and conveys the substrate holder 11 in a second conveying direction P2 is formed in a lower part of the conveyance drive member 33.

In the substrate holder conveying mechanism 3 according to this embodiment, the outbound-side conveying portion 33a located on the upper side of each of the conveyance drive members 33 and the return-path-side conveying portion 33c located on the lower side of each of the conveyance drive members 33 are configured to be opposed to each other and overlap with each other in the vertical direction.

Further, the substrate holder conveying mechanism 3 is provided with a substrate holder introduction portion 30A that introduces the substrate holder 11, a conveyance turnaround portion 30B that turns and conveys the substrate holder 11, and a substrate holder discharge portion 30C that discharges the substrate holder 11.

Here, a direction change mechanism 40 to be described below is provided in the vicinity of the conveyance turnaround portion 30B.

First and second processing regions 4 and 5 are provided in the vacuum chamber 2.

In this embodiment, in the vacuum chamber 2, the first processing region 4 including, for example, a sputter source 4T is provided in the upper part of the substrate holder conveying mechanism 3, and the second processing region 5 including, for example, a sputter source 5T is provided in the lower part of the substrate holder conveying mechanism 3.

In this embodiment, the outbound-side conveying portion 33a of the conveyance drive member 33 described above is configured to linearly pass through the first processing region 4 in the horizontal direction, and the return-path-side conveying portion 33c is configured to linearly pass through the above-mentioned second processing region 5 in the horizontal direction.

Then, in the case where the substrate holder 11 passes through the outbound-side conveying portion 33a and the return-path-side conveying portion 33c of the conveyance drive member 33 constituting a conveying path, the plurality of substrates 10 (FIG. 2A) held by the substrate holder 11 is conveyed while being horizontalized.

A substrate carry-in/carry-out mechanism 6 for delivering and receiving the substrate holder 11 to/from the substrate holder conveying mechanism 3 is provided in the vacuum chamber 2 at a position in the vicinity of the substrate holder conveying mechanism 3, e.g., a position adjacent to the first drive wheel 31.

The substrate carry-in/carry-out mechanism 6 according to this embodiment includes a support portion 62 provided at the tip (upper end) portion of a drive rod 61 driven in the vertical (up-and-down) direction by a lifting mechanism 60, for example.

In this embodiment, a conveying robot 64 is provided on the support portion 62 of the substrate carry-in/carry-out mechanism 6, the above-mentioned substrate holder 11 is supported on the conveying robot 64 and is caused to move in the vertical (up-and-down) direction, and the substrate holder 11 is delivered to/from the substrate holder conveying mechanism 3 by the conveying robot 64.

In this case, as will be described below, the substrate holder 11 is delivered from the substrate carry-in/carry-out mechanism 6 to the substrate holder introduction portion 30A of the outbound-side conveying portion 33a of the substrate holder conveying mechanism 3 (this position will be referred to as the "substrate holder delivery position"), and the substrate holder 11 is taken out from the substrate holder discharge portion 30C of the return-path-side conveying portion 33c of the substrate holder conveying mechanism 3 (this position will be referred to as the "substrate holder take-out position").

A substrate carry-in/carry-out chamber 2A for carrying the substrate 10 into the vacuum chamber 2 and carrying the substrate 10 out of the vacuum chamber 2 is provided, for example, in the upper part of the vacuum chamber 2.

This substrate carry-in/carry-out chamber 2A is provided, for example, at a position above the support portion 62 of the above-mentioned substrate carry-in/carry-out mechanism 6 via a communication port 2B, and an openable/closable lid portion 2a is provided, for example, in the upper part of the substrate carry-in/carry-out chamber 2A.

Then, as will be described below, the unprocessed substrate 10a carried into the substrate carry-in/carry-out chamber 2A is conveyed to and held by the substrate holder 11 on the conveying robot 64 of the support portion 62 of the substrate carry-in/carry-out mechanism 6, and the processed substrate 10b is carried out of the substrate holder 11 on the conveying robot 64 of the support portion 62 of the substrate carry-in/carry-out mechanism 6, for example, into the atmosphere outside the vacuum chamber 2.

Note that in this embodiment, a seal member 63 that isolates the atmospheres in the substrate carry-in/carry-out chamber 2A and the vacuum chamber 2 from each other when the substrate 10 is carried in and out, such as an O-ring, is provided at the upper edge of the support portion 62 of the substrate carry-in/carry-out mechanism 6.

In this case, the support portion 62 of the substrate carry-in/carry-out mechanism 6 is raised toward the substrate carry-in/carry-out chamber 2A side, and the seal member 63 on the support portion 62 is in close contact with the inner wall of the vacuum chamber 2 to seal the communication port 2B, thereby isolating the atmospheres in the substrate carry-in/carry-out chamber 2A from the atmosphere in the vacuum chamber 2.

As shown in FIGS. 2A and 2B, in the pair of the conveyance drive members 33 of the substrate holder conveying mechanism 3 according to this embodiment, a plurality of anti-sag members 35, which will be described below, is provided so as to project on the conveying-direction-outer side of the conveyance drive member 33 at predetermined intervals.

The anti-sag members 35 includes a traveling member 50 and a first drive unit 36, which will be described below, and the first drive unit 36 is configured to be in contact with a first driven unit 12 of the substrate holder 11 supported by a substrate holder supporting mechanism 18 described below to drive the substrate holder 11 in the first or second conveying direction P1 or P2.

A pair of substrate holder supporting mechanisms 18 that support the substrate holder 11 to be conveyed is provided inside the pair of conveyance drive members 33.

The substrate holder supporting mechanism 18 is formed of a rotatable member such as a plurality of rollers, and is provided in the vicinity of the conveyance drive member 33.

In this embodiment, the outbound-side substrate holder supporting mechanism 18a is provided in the vicinity of the upper part of the outbound-side conveying portion 33a of the conveyance drive member 33, the return-side substrate holder supporting mechanism 18c is provided in the vicinity of the lower part of the return-path-side conveying portion 33c of the conveyance drive member 33, and they are disposed to support both edges of the lower surface of the substrate holder 11 to be conveyed.

Note that the outbound-side substrate holder supporting mechanism 18a is provided up to the vicinity of the entrance port of a first direction change path 51 of the direction change mechanism 40, which will be described below, and the return-side substrate holder supporting mechanism 18c is provided up to the vicinity of a discharge port of a second direction change path 52 of the direction change mechanism 40, which will be described below.

The substrate holder 11 used in this embodiment is for performing vacuum processing on both surfaces of the substrate 10, and is a tray-like one including an opening.

As shown in FIG. 2A and FIG. 3A, the substrate holder 11 according to this embodiment is formed in, for example, a flat plate shape of an elongated rectangle, and a plurality of holding units 14 that holds a plurality of substrates 10 each having, for example, a rectangular shape is provided, the plurality of substrates 10 being disposed side by side in a column in a direction (hereinafter, referred to as the "direction perpendicular to the conveying direction") perpendicular to the longitudinal direction i.e. the first and second conveying directions P1 and P2.

Here, each of the plurality of holding units 14 is provided with, for example, a rectangular opening having the same size and shape as those of each of the substrates 10 and exposing both surfaces of each of the substrate 10 entirely, and is configured to hold each of the substrates 10 by a holding member (not shown).

The present invention is not particularly limited, but it is favorable to configure the substrate holder 11 so that the plurality of substrates 10 is disposed and held in a column in the direction perpendicular to the conveying direction as in this embodiment from the viewpoint of reducing the installation area and improving the throughput.

However, from the viewpoint of improving the processing efficiency, the plurality of substrates 10 can be disposed in a plurality of columns in the direction perpendicular to the conveying direction.

Meanwhile, the first driven unit 12 is provided at each end on the second conveying direction P2 side at both ends of the substrate holder 11 in the longitudinal direction, and a second driven unit 13 is provided at each end on the first conveying direction P1 side.

Each of these first and second driven units 12 and 13 includes a shaft member formed in a circular cross-section about a rotation axis extending in the direction perpendicular to the longitudinal direction of the substrate holder 11, i.e., the first and second conveying directions P1 and P2, (see FIGS. 3A and 3B).

In this embodiment, the dimensions are determined so that the length of the second driven unit 13 is longer than the length of the first driven unit 12.

More specifically, as shown in FIG. 2A, the dimensions of the first and second driven units 12 and 13 are determined so that the first driven units 12 on both sides of the substrate holder 11 are in contact with the first drive unit 36 of the substrate holder conveying mechanism 3 in the case where the substrate holder 11 is disposed in the substrate holder conveying mechanism 3, and the second driven unit 13 is in contact with a second drive unit 46 described below in the case where the substrate holder 11 is disposed in the direction change mechanism 40 described below.

A pair of direction change mechanisms 40 of the same configuration are provided on the first conveying direction P1 side of the pair of conveyance drive members 33.

In this embodiment, the pair of direction change mechanisms 40 are disposed at positions on the outer side of the pair of conveyance drive members 33 with respect to the first and second conveying directions P1 and P2.

Further, the pair of direction change mechanisms 40 are provided so that a portion thereof on the second conveying direction P2 side slightly overlaps a portion of the conveyance drive member 33 on the first conveying direction P1 side.

As shown in FIG. 4, the direction change mechanism 40 according to this embodiment includes a first guide member 41, a second guide member 42, and a third guide member 43, and these first to third guide members 41 to 43 are disposed in this order from the upstream side of the first conveying direction P1.

In this embodiment, the first to third guide members 41 to 43 are each disposed at a position in the vicinity of the outside of the pair of conveyance drive members 33, and a conveyance drive member 45, which will be described below, is disposed at a position in the vicinity of the outside of each of the first to third guide members 41 to 43.

Note that in FIG. 2B, a part of the direction change mechanism 40 is omitted, and the positional relationship between the members in the conveying direction is shown to be clear while ignoring the overlapping relationship of the members.

As shown in FIG. 2A and FIG. 4, the first to third guide members 41 to 43 each include, for example, a plate-shaped member, and are provided toward the vertical direction.

Here, a portion of the first guide member 41 on the first conveying direction P1 side is formed in a curved surface shape that projects toward the first conveying direction P1 side, and a portion of the second guide member 42 on the second conveying direction P2 side is formed in a curved surface shape that is recessed toward the first conveying direction P1 side.

The first and second guide members 41 and 42 are closely positioned so that the portion of the first guide member 41 on the first conveying direction P1 side and the portion of the second guide member 42 on the second conveying direction P2 side are formed to have equivalent curved surface shapes and face each other with a gap slightly larger than the diameter of the first driven unit 12 of the substrate holder 11. Then, the first direction change path 51 that guides the first driven unit 12 of the substrate holder 11 is provided by the gap.

Further, the portion of the second guide member 42 on the first conveying direction P1 side is formed in a curved surface shape that projects toward the first conveying direction P1 side, and the portion of the third guide member 43 on the second conveying direction P2 side is formed in a curved surface shape that is recessed toward the first conveying direction P1 side.

The second and third guide members 42 and 43 are closely positioned so that the portion of the second guide member 42 on the first conveying direction P1 side and the portion of the third guide member 43 on the second conveying direction P2 side are formed to have equivalent curved surface shapes and face each other with a gap slightly larger than the diameter of the second driven unit 13 of the substrate holder 11. Then, the second direction change path 52 that guides the second driven unit 13 of the substrate holder 11 is provided by the gap.

Then, with such a configuration, the first direction change path 51 and the second direction change path 52 are formed in equivalent curved surface shapes.

Further, in this embodiment, the dimensions are determined so that each of the distances of the respective portions of the first and second direction change paths 51 and 52 in the horizontal direction is equivalent to the distance between the first and second driven units 12 and 13 of the substrate holder 11.

Further, in this embodiment, the upper port of the first direction change path 51 serves as the entrance port of the first driven unit 12 of the substrate holder 11, and the height position thereof is lower than the height position of the second driven unit 13 of the substrate holder 11 supported by the outbound-side substrate holder supporting mechanism 18*a* (see FIG. 2B).

Further, the lower port of the first direction change path 51 serves as the discharge port of the first driven unit 12 of the substrate holder 11, and the height position thereof is higher than the height position of the second driven unit 13 of the substrate holder 11 supported by the return-side substrate holder supporting mechanism 18*c* (see FIG. 2B).

Further, the upper port of the second direction change path 52 serves as the entrance port of the second driven unit 13 of the substrate holder 11, and the height position thereof is equivalent to the height position of the second driven unit 13 of the substrate holder 11 supported by the outbound-side substrate holder supporting mechanism 18*a* (see FIG. 2B).

Meanwhile, the lower port of the second direction change path 52 serves as the discharge port of the second driven unit 13 of the substrate holder 11, and the height position thereof is equivalent to the height position of the second driven unit 13 of the substrate holder 11 supported by the return-side substrate holder supporting mechanism 18*c* (see FIG. 2B).

The direction change mechanism 40 according to this embodiment includes the conveyance drive member 45 including, for example, a pair of sprockets and a conveyor chain bridged over the pair of sprockets, and the conveyance drive member 45 is configured to have a continuous ring shape on the vertical surface.

The conveyance drive member 45 is configured such that the radius of curvature of the turnaround portion thereof is equivalent to the radius of curvature of the turnaround portion 33*b* of the conveyance drive member 33 of the substrate holder conveying mechanism 3.

Further, the upper portion of the conveyance drive member 45 is driven to move in the first conveying direction P1, and the lower portion thereof is driven to move in the second conveying direction P2.

The conveyance drive member 45 is provided with a plurality of second drive units 46 that projects toward the outer side of the conveyance drive member 45 at predetermined intervals.

The second drive unit 46 is configured such that a recessed portion is formed in the portion of the conveyance drive member 45 on the outer side and the edge of the recessed portion is in contact with the second driven unit 13 of the substrate holder 11 to support and drive the substrate holder 11 along the second direction change path 52.

Further, as will be described below, the path of the conveyance drive member 45 and the dimensions of the second drive unit 46 are set (see FIG. 2B) so that the end of the second drive unit 46 according to this embodiment on the recessed portion side is retracted from the second direction change path 52 when the second drive unit 46 reaches the positions of the entrance port and the discharge port of the second direction change path 52.

In this embodiment, as will be described below, the operations of the conveyance drive member 33 and the conveyance drive member 45 of the direction change mechanism 40 are controlled so that the second drive unit 46 operates in synchronization with the first drive unit 36 of the anti-sag member 35 provided in the conveyance drive member 33.

Then, in this embodiment, the shapes and dimensions of the first and second drive units 36 and 46 and the first and second direction change paths 51 and 52 are set so that in the case where the substrate holder 11 is driven in the first conveying direction P1 by the first drive unit 36 of the anti-sag member 35 to cause the first and second driven units 12 and 13 to enter the first and second direction change paths 51 and 52, the first and second driven units 12 and 13 are supported and caused to move by the first and second drive units 36 and 46 while maintaining the vertical relationship of the substrate holder 11 and smoothly discharged from the first and second direction change paths 51 and 52.

Meanwhile, in the vicinity of the discharge port of the first direction change path 51 below the first guide member 41 and the second guide member 42, a delivery member 47 for smoothly delivering the substrate holder 11 from the direction change mechanism 40 to the return-side substrate holder supporting mechanism 18c of the substrate holder supporting mechanism 18 is provided.

The delivery member 47 includes, for example, an elongate member that extends in the horizontal direction, and is configured to rotate in the up-and-down direction about a rotation shaft 48 extending in the first and second conveying directions P1 and P2, which is provided at a position below the return-side substrate holder supporting mechanism 18c at the end on the second conveying direction P2 side. Then, a portion of the delivery member 47 on the first conveying direction P1 side is urged upward by an elastic member (not shown).

A delivery portion 47a (see FIG. 2B) is provided in the upper part of the delivery member 47, the delivery portion 47a being formed to have a curved surface shape so as to continue with the first direction change path 51 and continue with the return-side substrate holder supporting mechanism 18c of the substrate holder supporting mechanism 18 in the vicinity of the discharge port of the first direction change path 51 on the second conveying direction P2 side.

Further, in the upper part of the delivery member 47, an inclined surface 47b inclined downward toward the first conveying direction P1 is provided at the position on the first conveying direction P1 side. The inclined surface 47b is provided at a height position facing the discharge port of the second direction change path 52.

Figures 5A, 5B, 5C:
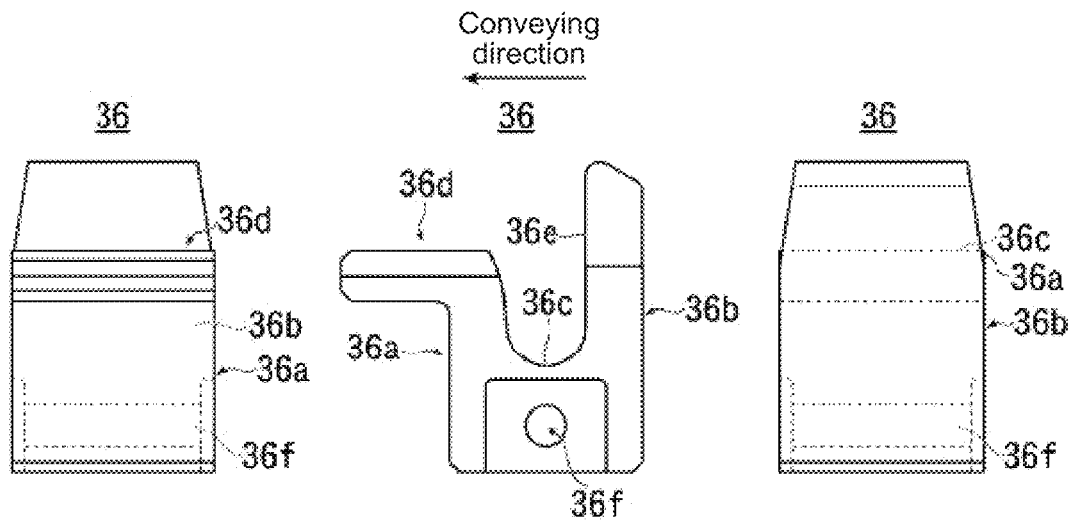
FIGS. 5A-5D each show a configuration of a first drive unit provided in a conveyance drive member according to this embodiment, FIG. 5A being a side surface diagram as viewed from the downstream side of the conveying direction, FIG. 5B being a front view, FIG. 5C being a side surface diagram as viewed from the upstream side of the conveying direction, FIG. 5D being a perspective view.
Figure 5D:
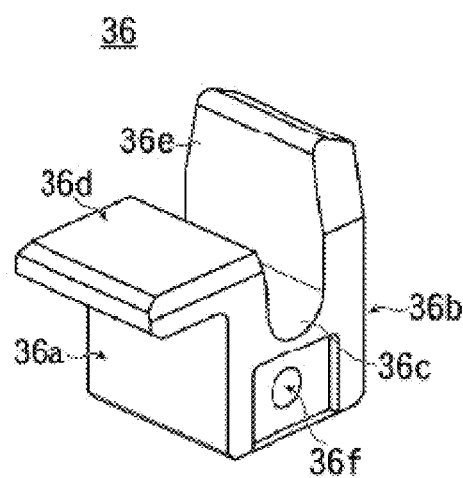

FIGS. 5A-5D each show a configuration of a first drive unit used in this embodiment, FIG. 5A being a side surface diagram as viewed from the downstream side of the conveying direction, FIG. 5B being a front view, FIG. 5C being a side surface diagram as viewed from the upstream side of the conveying direction, FIG. 5D being a perspective view.

As shown in FIGS. 5A-5D, the first drive unit 36 according to this embodiment is formed in, for example, a J-hook shape (a shape in which a groove portion 36c is formed such that the height of a first protruding portion 36a on the downstream side of the conveying direction is lower than the height of a second protruding portion 36b on the upstream side of the conveying direction).

This groove portion 36c is formed to extend in the direction (width direction) perpendicular to the conveying direction. Then, a screw hole 36f that extends in the direction perpendicular to the conveying direction and penetrates the first drive unit 36 is provided on the inner side of the conveying direction of the groove portion 36c.

Meanwhile, in this embodiment, a stopper portion 36d is provided on the upper part of the first protruding portion 36a.

The stopper portion 36d is formed so as to extend in the direction perpendicular to the first and second protruding portions 36a and 36b, and the portion thereof on the conveying-direction-outer side is formed in a planar shape.

In this embodiment, the shapes and dimensions of the respective portions of the first drive unit 36 are set so that the end of the second protruding portion 36b of the first drive unit 36 on the conveying-direction-outer side is located on the conveying-direction-outer side than the end (surface) of the stopper portion 36d on the conveying-direction-outer side.

Further, a drive surface 36e that is in contact with and drives the first driven unit 12 of the substrate holder 11 is provided on the first protruding portion 36a side of the second protruding portion 36b of the first drive unit 36.

This drive surface 36e is formed in a planar shape so as to extend in the direction perpendicular to the conveying direction.

FIGS. 6A-6D each show a traveling member used in this embodiment, FIG. 6A being a side surface diagram as viewed from the downstream side of the conveying direction, FIG. 6B being a front view, FIG. 6C being a side surface diagram as viewed from the upstream side of the conveying direction, FIG. 6D being a perspective view.

The traveling member 50 according to this embodiment is formed of, for example, a metal such as stainless steel, and includes a body frame 50a formed to be wider than the width of the first drive unit 36 described above.

In this body frame 50a, a holding frame portion 50b that holds the first drive unit 36 is provided in a portion on the downstream side of the conveying direction.

The holding frame portion 50b includes a pair of plate-like portions extending in the conveying direction, and the pair of plate-like portions are provided at an interval equivalent to the width of the first drive unit 36.

A fixing screw 53 that includes a bolt for fixing the first drive unit 36 is mounted to the holding frame portion 50b of the body frame 50a so as to penetrate through a screw hole 52a of the holding frame portion 50b toward the direction perpendicular to the conveying direction.

Meanwhile, a roller holding frame portion 55 for holding a travel roller 54, which will be described below, is provided on the upstream side of the conveying direction of the body frame 50a.

This roller holding frame portion 55 includes a pair of plate-like frames that is formed to extend in the conveying direction and project toward the conveying-direction-outer side, and the pair of frames of the roller holding frame portion 55 are provided at an interval equivalent to the width of the first drive unit 36.

A fixing screw 56 that includes a bolt is mounted to the roller holding frame portion 55 of the body frame 50a so as to penetrate through the roller holding frame portion 55 toward the direction perpendicular to the conveying direction, and the cylindrical travel roller 54 is configured to rotate about a rotation axis 0 extending in the direction perpendicular to the conveying direction in this fixing screw 56 (see FIGS. 6A and 6B).

For example, a roller bearing or the like can be used as the travel roller 54.

FIGS. 7A-7C each show a configuration of an anti-sag member used in this embodiment, FIG. 7A being a side surface diagram as viewed from the downstream side of the conveying direction, FIG. 7B being a front view, FIG. 7C being a perspective view.

As shown in FIGS. 7A-7C, the anti-sag member 35 according to this embodiment is obtained by assembling the first drive unit 36 shown in FIGS. 5A-5D and the traveling member 50 shown in FIGS. 6A-6D.

In this case, the first drive unit 36 is disposed between the pair of holding frame portions 50b of the body frame 50a of the traveling member 50 with the first protruding portion 36a facing the downstream side of the conveying direction, the fixing screw 53 penetrates the screw hole 52a of the traveling member 50 and the screw hole 36f of the first drive unit 36 (see FIGS. 5A-5C), and the fixing screw 53 and a nut 57 fix the first drive unit 36 to the holding frame portion 50b of the body frame 50a.

In this embodiment, the shapes and dimensions of the respective portions of the traveling member 50 and the first drive unit 36 are set so that the end of the travel roller 54 of the traveling member 50 on the conveying-direction-outer side is located on the conveying-direction-outer side than the end of the second protruding portion 36b of the first drive unit 36 on the conveying-direction-outer side.

Note that as will be described below, for example, a plate-like mounting member 58 for mounting the anti-sag member 35 to the conveyance drive member 33 is inserted and fixed between the holding frame portion 50b of the traveling member 50 and both side surfaces of the first drive unit 36.

FIGS. 8A and 8B each show an anti-sag member mounted to a conveyance drive member, FIG. 8A being a front view, FIG. 8B being a cross-sectional view taken along the line A-A in Part FIG. 8A.

Figure 9:
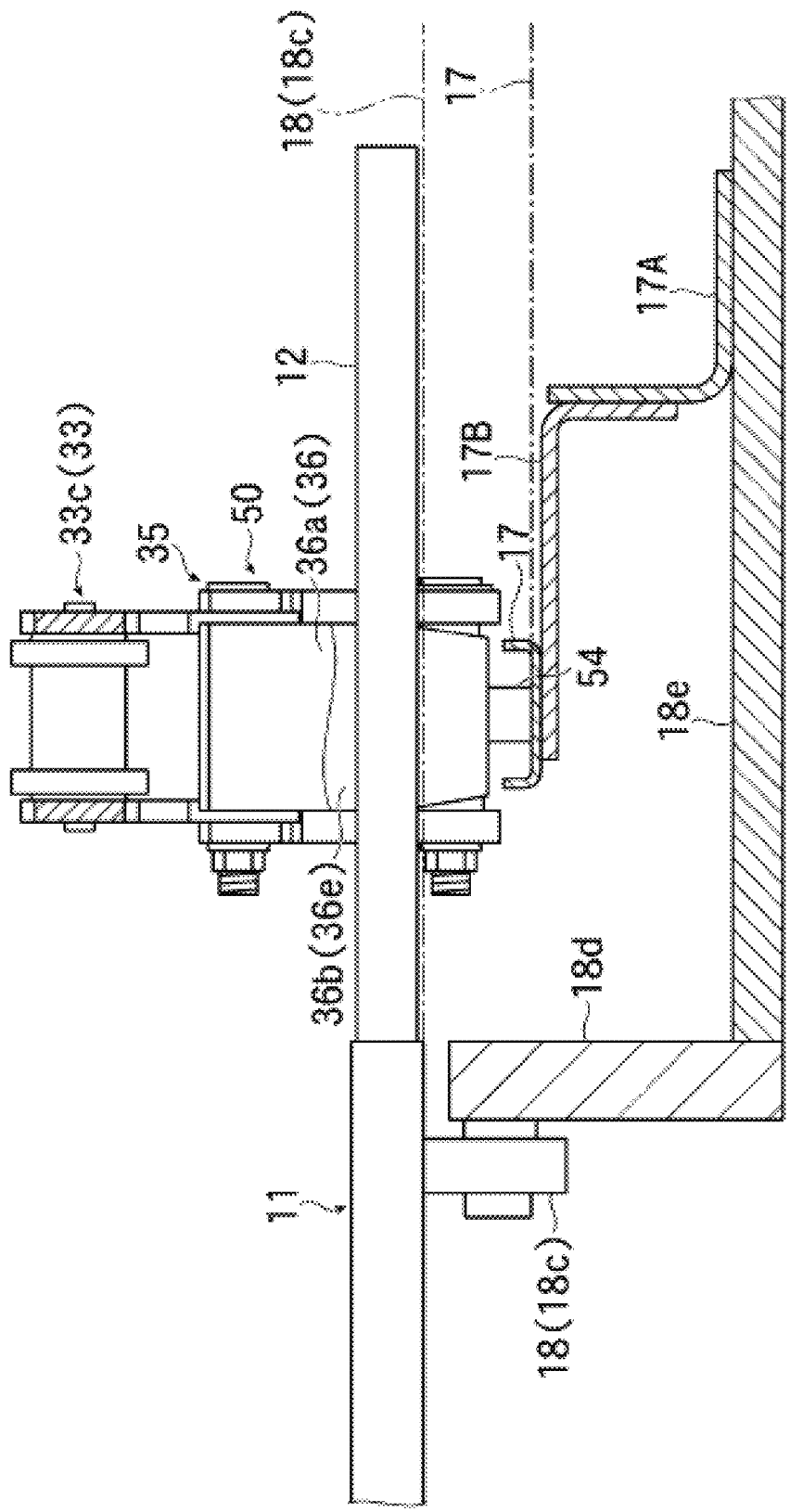
FIG. 9 is a partial cross-sectional view showing a mounting structure of a guide unit according to this embodiment.

FIG. 9 is a partial cross-sectional view showing a mounting structure of a guide unit according to this embodiment.

Figure 10:
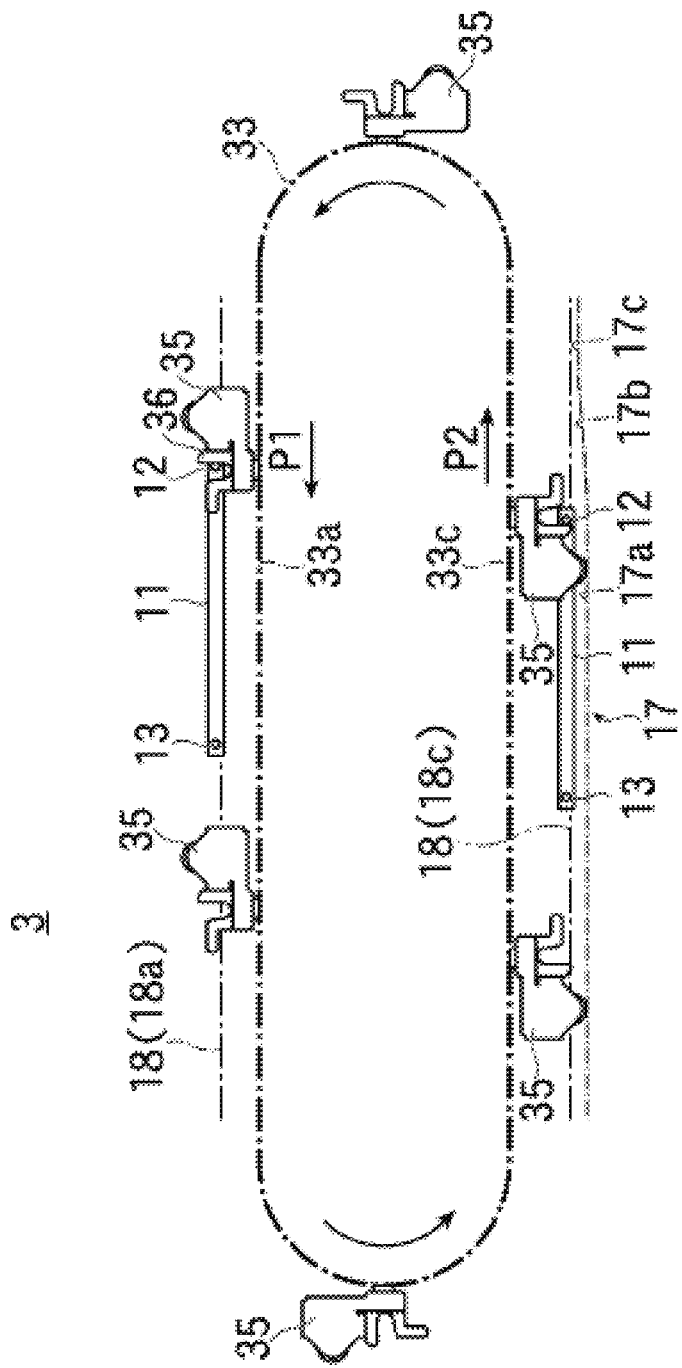
FIG. 10 is a schematic configuration diagram of a substrate holder conveying mechanism according to this embodiment.

FIG. 10 is a schematic configuration diagram of a substrate holder conveying mechanism according to this embodiment.

As shown in FIGS. 8A and 8B, the conveyance drive member 33 used in this embodiment includes a general conveyor chain, and includes an outer link portion 33d, an inner link portion 33e, and a roller 33f rotatably mounted to a connecting portion between the outer link portion 33d and the inner link portion 33e by a pin and a bushing (not shown).

Then, plate-like connecting members 59 extending in, for example, the conveying-direction-outer side are fixed to the inner portion of the pair of mounting members 58 of the above-mentioned anti-sag member 35 with respect to the conveying direction, the inner portion of the pair of connecting members 59 with respect to the conveying direction is fixed to the portion of the pair of plates of the outer link portion 33d of the conveyance drive member 33 on the conveying-direction-outer side, and thus, the anti-sag member 35 is mounted to the conveyance drive member 33 while the travel roller 54 is disposed on the conveying-direction-outer side.

As shown in FIGS. 8A and 8B, in this embodiment, when the anti-sag member 35 is located at the lower portion of the conveyance drive member 33, i.e., the return-path-side conveying portion 33c, the travel roller 54 is located below the return-path-side conveying portion 33c and the lower end of the travel roller 54 is located at the lowest position of the anti-sag member 35.

In this embodiment, the travel roller 54 of the anti-sag member 35 is configured to be guided and supported by a guide unit 17 provided below the return-path-side conveying portion 33c of the conveyance drive member 33.

This guide unit 17 is formed to extend in the conveying direction as shown in FIG. 10, and the guide wall portion for inhibiting falling off extending in the vertical direction is provided on both side portions thereof as shown in FIG. 9.

In this embodiment, a plate-like base 18e fixed toward the horizontal direction is provided so as to extend in the conveying direction with respect to a holding member 18d erected so as to extend in the conveying direction for holding the return-side substrate holder supporting mechanism 18c, which includes, for example, a roller, of the substrate holder supporting mechanism 18, a mounting member 17A having, for example, an L-shape is fixed on this base 18e, and a the guide unit 17 is fixed on a horizontal plane of a support member 17B fixed to this mounting member 17A.

Then, as shown in FIG. 9 and FIG. 10, this guide unit 17 is provided so that the support surface is located below the support portion of the return-side substrate holder supporting mechanism 18c of the substrate holder supporting mechanism 18.

the guide unit 17 according to this embodiment is provided with a traveling portion 17a that extends in the horizontal direction toward the second conveying direction P2, an upper inclined portion 17b that is connected to the traveling portion 17a and inclined obliquely upward, and a contact release portion 17c that is connected to the upper inclined portion 17b and extends in the horizontal direction.

The upper inclined portion 17b and the contact release portion 17c are for releasing the contact between the first driven unit 12 of the substrate holder 11 and the first drive unit 36 of the anti-sag member 35, as will be described in detail below.

Hereinafter, the operation of the vacuum processing apparatus 1 according to this embodiment will be described with reference to FIG. 11 to FIG. 21.

Figure 11:
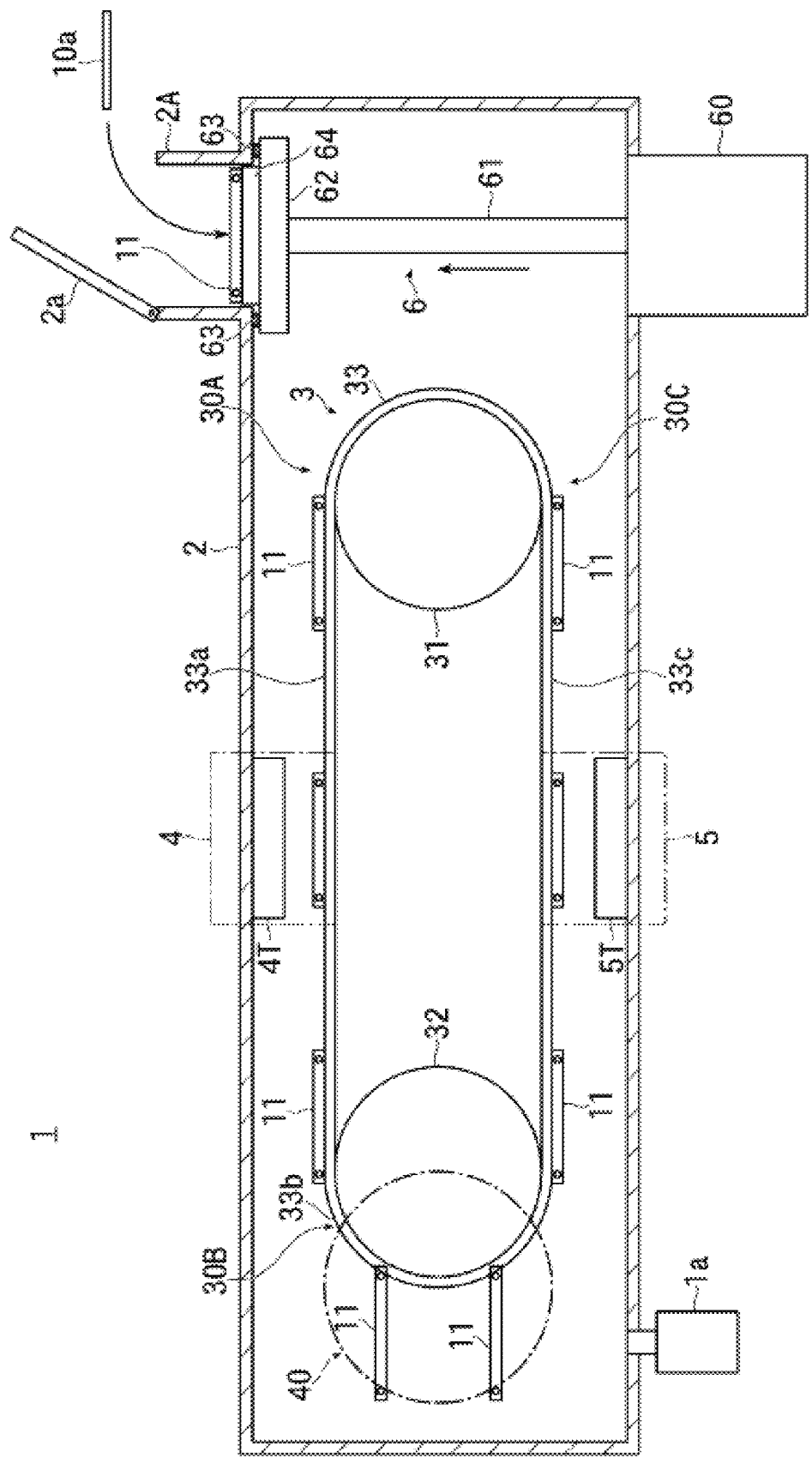
FIG. 11 is an explanatory diagram showing an operation of a vacuum processing apparatus according to this embodiment (Part 1).

As shown in FIG. 11, in this embodiment, the seal member 63 on the support portion 62 of the substrate carry-in/carry-out mechanism 6 is brought into close contact with the inner wall of the vacuum chamber 2 first, and the lid portion 2a of the substrate carry-in/carry-out chamber 2A is opened after venting to the atmospheric pressure while the atmosphere in the substrate carry-in/carry-out chamber 2A is isolated from the atmosphere in the vacuum chamber 2.

After that, the unprocessed substrate 10a is mounted and held to/in the substrate holder 11 on the conveying robot 64 of the support portion 62 of the substrate carry-in/carry-out mechanism 6 using a conveying robot (not shown).

Figure 12:
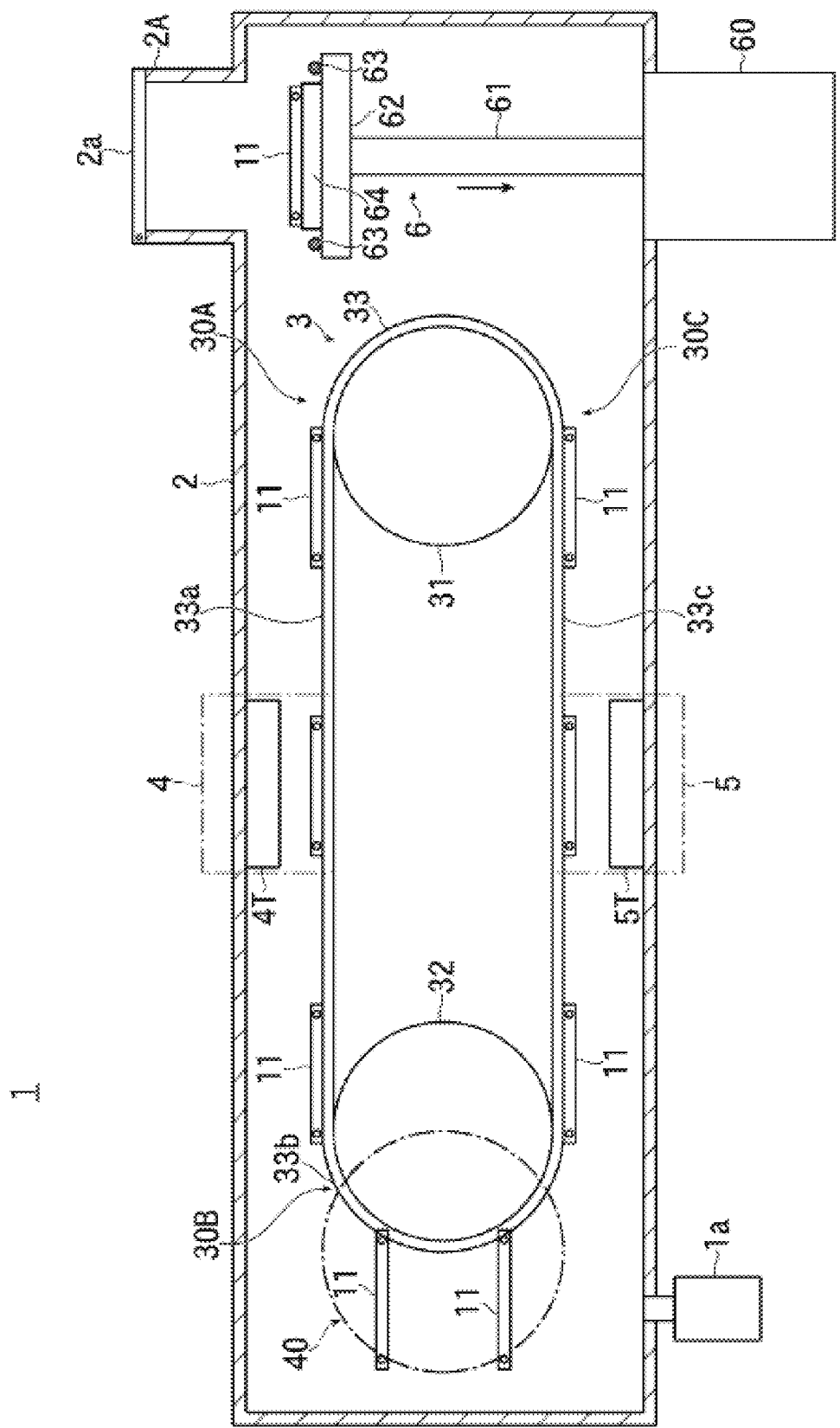
FIG. 12 is an explanatory diagram showing the operation of the vacuum processing apparatus according to this embodiment (Part 2).

Then, as shown in FIG. 12, after the lid portion 2a of the substrate carry-in/carry-out chamber 2A is closed and evacuated to a predetermined pressure, the support portion 62 of the substrate carry-in/carry-out mechanism 6 is lowered to the above-mentioned substrate holder delivery position so that the height of the substrate holder 11 is a height position equivalent to the outbound-side conveying portion 33a of the conveyance drive member 33.

Figure 13:
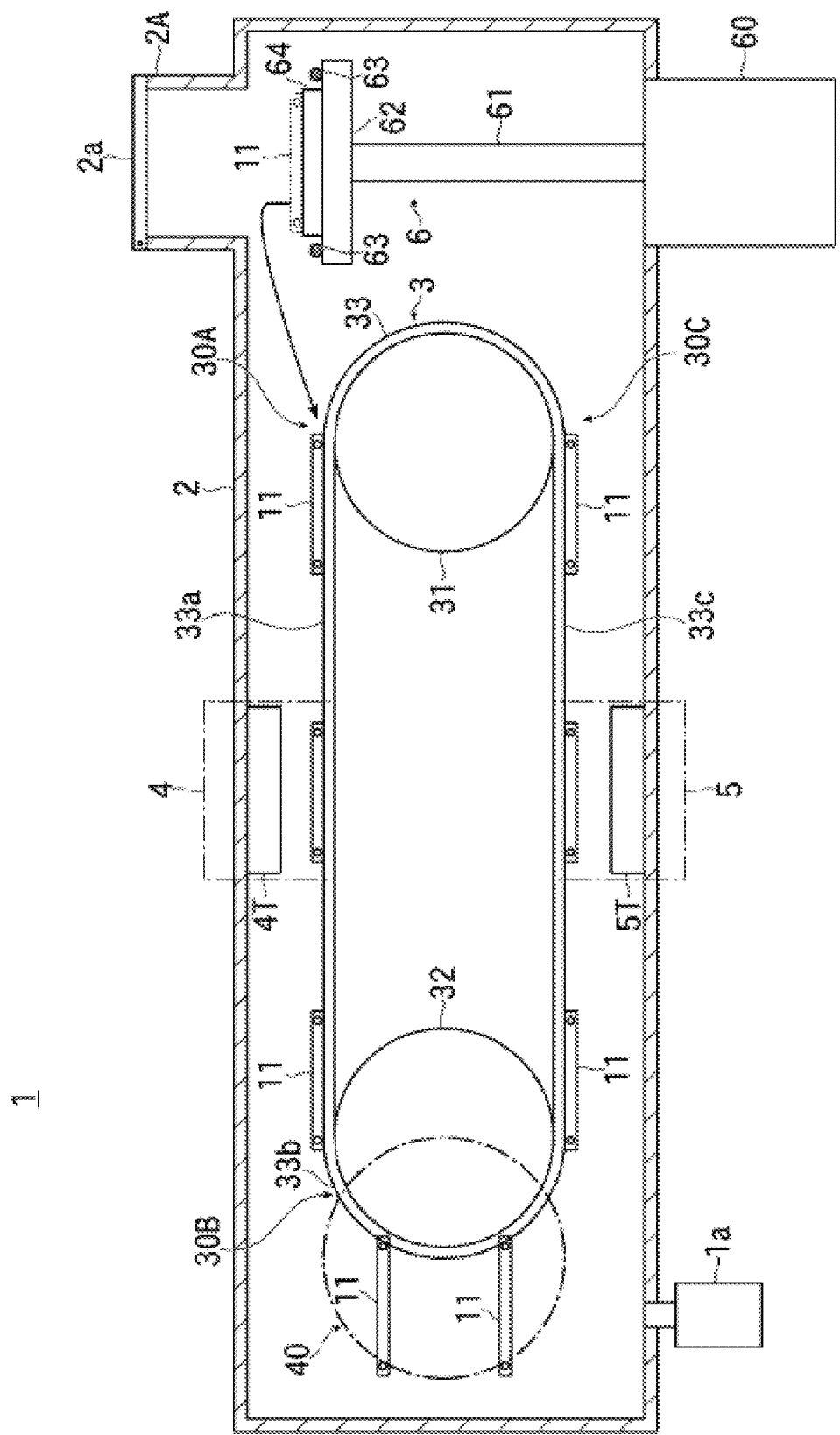
FIG. 13 is an explanatory diagram showing the operation of the vacuum processing apparatus according to this embodiment (Part 3).
Figure 14:
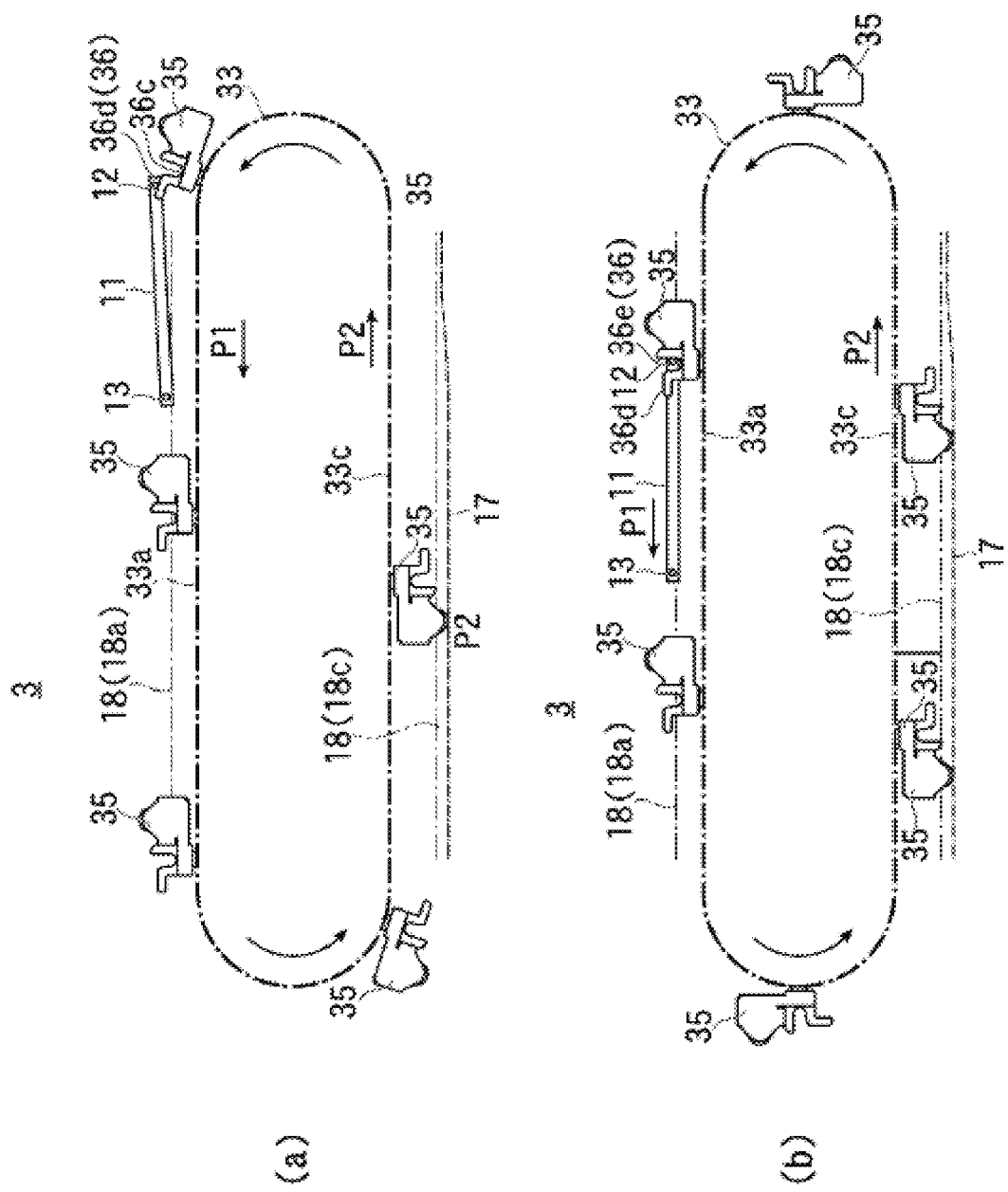
FIGS. 14A and 14B are each an explanatory diagram showing an operation of a substrate holder conveying mechanism according to this embodiment (Part 1).

Further, as shown in FIG. 13, the substrate holder 11 is disposed on the substrate holder introduction portion 30A of the substrate holder conveying mechanism 3 by the conveying robot 64 provided in the support portion 62 of the substrate carry-in/carry-out mechanism 6.

In this case, although the first driven unit 12 of the substrate holder 11 is positioned so as to be disposed within the groove portion 36c (see FIGS. 5A-5D) of the first drive unit 36 of the anti-sag member 35 and placed on the outbound-side substrate holder supporting mechanism 18a, the moving of the anti-sag member 35 is delayed to cause a timing shift during this operation and the first driven unit 12 cannot be disposed in the groove portion 36c of the first drive unit 36 in some cases.

However, in this embodiment, since the stopper portion 36d is provided in the first drive unit 36 of the anti-sag member 35 as described above, the tip portion of the stopper portion 36d of the first drive unit 36 on the first conveying direction P1 side faces upward and is inclined so that the portion of the upper surface on the upstream side of the conveying direction (rear side) is lower as shown in FIG. 14A in the case where the moving of the anti-sag member 35 is delayed, the first driven unit 12 of the substrate holder 11 comes into contact with the upper surface of the stopper portion 36d of the first drive unit 36, the substrate holder 11 stops at that position, and the conveyance drive member 33 is caused to slightly operate, thereby allowing the first driven unit 12 to be smoothly positioned within the groove portion 36c of the first drive unit 36.

After that, as shown in FIG. 14B, the outbound-side conveying portion 33a of the conveyance drive member 33 of the substrate holder conveying mechanism 3 is caused to move in the first conveying direction P1 in this state.

As a result, the first driven unit 12 of the substrate holder 11 is driven in the first conveying direction P1 by the first drive unit 36 on the outbound-side conveying portion 33a of the conveyance drive member 33, and the substrate holder 11 is conveyed on the outbound-side conveying portion 33a of the conveyance drive member 33 toward the conveyance turnaround portion 30B.

In this case, when passing through the position of the first processing region 4 shown in FIG. 11, predetermined vacuum processing (e.g., deposition by sputtering) is performed on a first surface on the first processing region 4 side of the unprocessed substrate 10a held in the substrate holder 11.

FIGS. 15A-15C and FIGS. 16A-16C are each an explanatory diagram showing an operation of a substrate holder conveying mechanism and a direction change mechanism according to this embodiment.

Figure 15A:
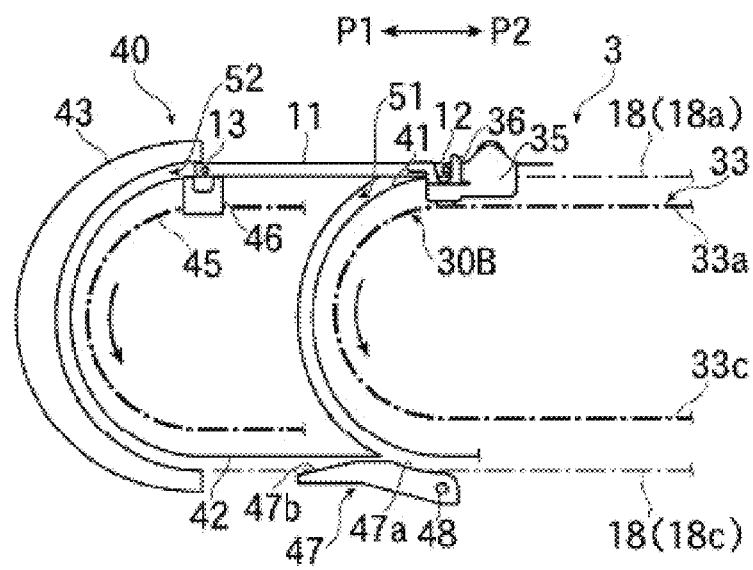
FIGS. 15A-15C are each an explanatory diagram showing an operation of a substrate holder conveying mechanism and a direction change mechanism according to this embodiment (Part 1).

In this embodiment, by causing the first drive unit 36 of the anti-sag member 35 mounted to the conveyance drive member 33 to move in the first conveying direction P1, the substrate holder 11 that has reached the conveyance turnaround portion 30B of the substrate holder conveying mechanism 3 is caused to further move in the first conveying direction P1 as shown in FIG. 15A, and the second driven unit 13 of the substrate holder 11 is disposed at the position of the entrance port of the second direction change path 52 of the direction change mechanism 40.

In this case, the operation of the conveyance drive member 45 is controlled so that the second drive unit 46 of the direction change mechanism 40 is located below the second driven unit 13 of the substrate holder 11.

Then, the conveyance drive member 33 is driven to cause the first drive unit 36 of the anti-sag member 35 to move in the first conveying direction P1, and the conveyance drive member 45 of the direction change mechanism 40 is driven to cause the second drive unit 46 to move in the first conveying direction P1. In this case, the operations of the first drive unit 36 of the anti-sag member 35 and the second drive unit 46 are controlled so as to be synchronized.

Figure 15B:
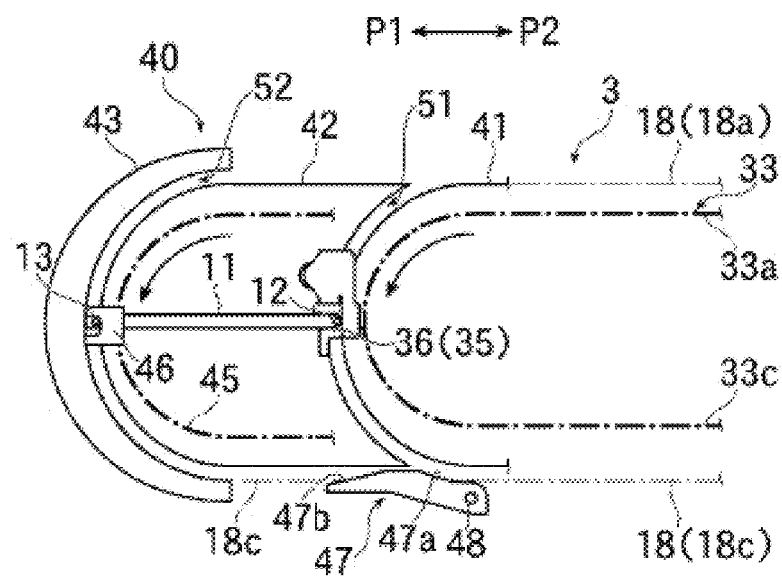

As a result, as shown in FIG. 15B, the first and second driven units 12 and 13 of the substrate holder 11 are supported and driven by the first drive unit 36 of the anti-sag member 35 and the second drive unit 46, and caused to move downward in the first and second direction change paths 51 and 52.

Note that in this process, the first driven unit 12 of the substrate holder 11 is in contact with not both but one of the edge of the first guide member 41 and the edge of the second guide member 42 in the first direction change path 51, and the second driven unit 13 is in contact with not both but one of the edge of the second guide member 42 and the edge of the third guide member 43 in the second direction change path 52. In this case, the substrate holder 11 maintains the vertical relationship.

Then, from the vicinity where the first and second driven units 12 and 13 pass through the middle parts of the first and second direction change paths 51 and 52, the conveying directions of the first and second driven units 12 and 13 are turned to the second conveying direction P2 opposite to the first conveying direction P1 while maintaining the vertical relationship of the substrate holder 11.

Note that in this process, the first driven unit 12 of the substrate holder 11 is in contact with not both but one of the edge of the first guide member 41 and the edge of the second guide member 42 in the first direction change path 51, and the second driven unit 13 is in contact with not both but one of the edge of the second guide member 42 and the edge of the third guide member 43 in the second direction change path 52.

Figure 15C:
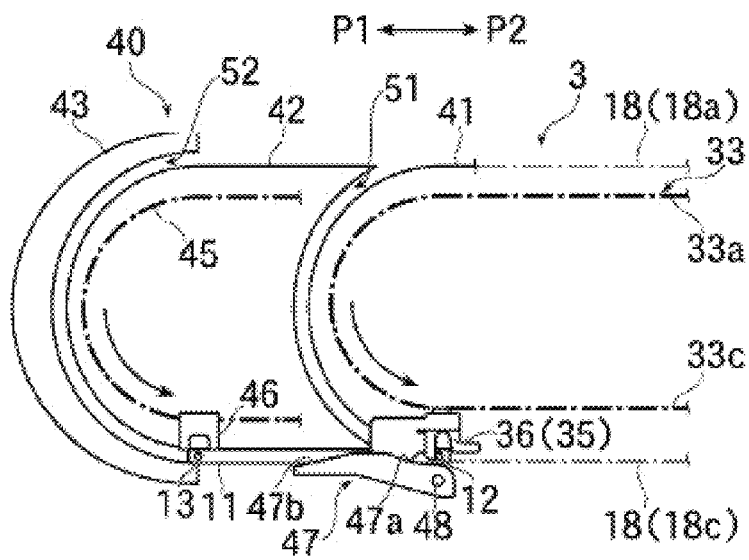
Figure 16A:
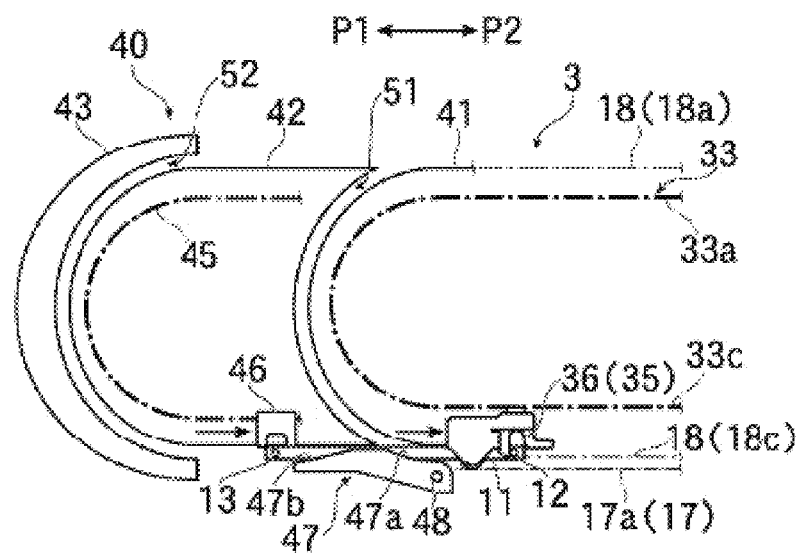
FIGS. 16A-16C are each an explanatory diagram showing an operation of the substrate holder conveying mechanism and the direction change mechanism according to this embodiment (Part 2).

Further, when the driving of the conveyance drive member 33 of the substrate holder conveying mechanism 3 and the conveyance drive member 45 of the direction change mechanism 40 is continued, the first driven unit 12 of the substrate holder 11 is disposed at a position above the delivery member 47 through the discharge port of the first direction change path 51 and the delivery portion 47a of the delivery member 47 as shown in FIG. 15C, the second driven unit 13 of the substrate holder 11 is disposed at a position of the discharge port of the second direction change path 52, and then, the substrate holder 11 is delivered to the return-side substrate holder supporting mechanism 18c of the substrate holder supporting mechanism 18 as shown in FIG. 16A.

Further, the anti-sag member 35 is supported by the traveling portion 17a of the guide unit 17 described above.

Here, when considering from the viewpoint of inhibiting the sagging, the traveling portion 17a of the guide unit 17 may be provided only at a position where the sagging of the conveyance drive member 33 is problematic. In this case, there is a case where the anti-sag member 35 is not supported by the traveling portion 17a of the guide unit 17 at the same time as the above-mentioned delivery to the return-side substrate holder supporting mechanism 18c.

Note that the second drive unit 46 of the direction change mechanism 40 and the second driven unit 13 of the substrate holder 11 are not in contact with each other at the time point shown in FIG. 15C, and the substrate holder 11 is driven to move in the second conveying direction P2 by the contact of the first drive unit 36 of the anti-sag member 35 with the first driven unit 12.

Figure 16B:
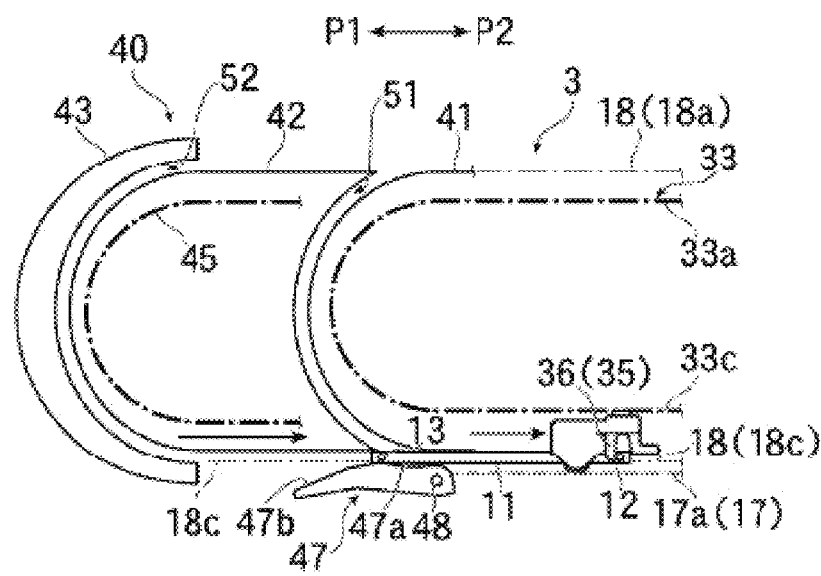
Figure 16C:
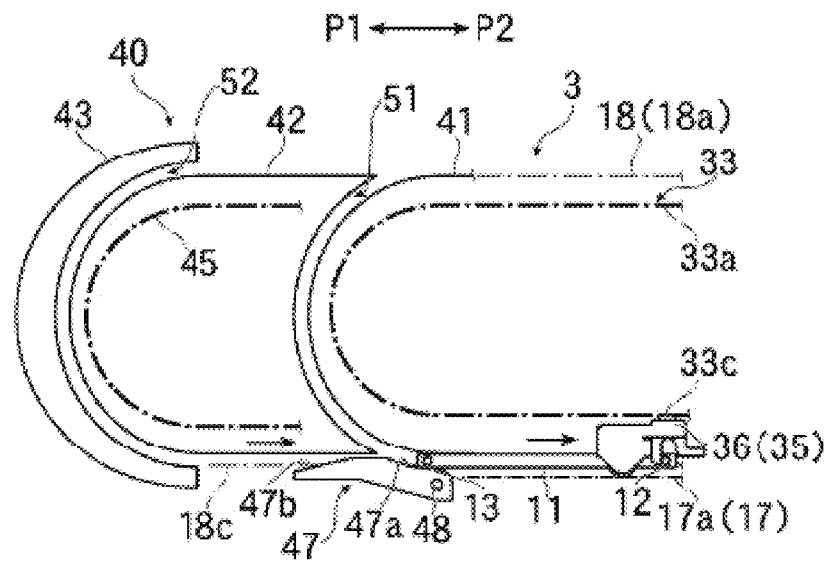

Then, when the conveyance drive member 33 of the substrate holder conveying mechanism 3 is further driven, the second driven unit 13 of the substrate holder 11 is in contact with the inclined surface 47b of the delivery member 47 and the delivery member 47 rotates and moves downward as shown in FIG. 16B, and the second driven unit 13 of the substrate holder 11 passes over the delivery member 47 and the substrate holder 11 moves in the second conveying direction P2 as shown in FIG. 16C.

Note that after this process, the delivery member 47 returns to its original position by the urging force of an elastic member (not shown).

Figure 17A:
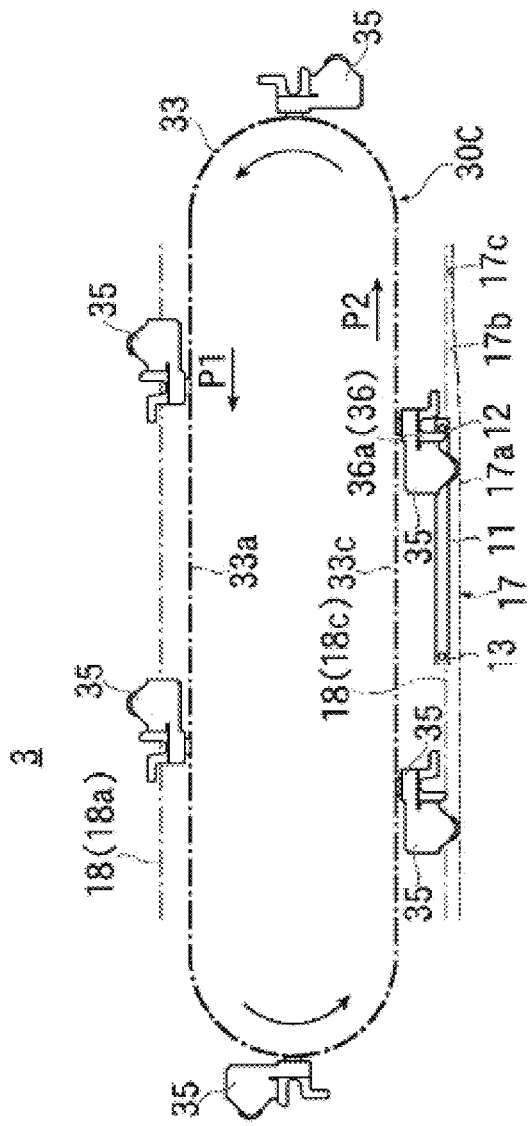
FIGS. 17A and 17B are each an explanatory diagram showing the operation of the substrate holder conveying mechanism (Part 2).

After that, as shown in FIG. 17A, the return-path-side conveying portion 33c of the conveyance drive member 33 is caused to move in the second conveying direction P2, and the substrate holder 11 is conveyed toward the substrate holder discharge portion 30C by driving the first driven unit 12 in the same direction by the first drive unit 36 of the anti-sag member 35.

In this case, when passing through the position of the second processing region 5 shown in FIG. 11, predetermined vacuum processing (e.g., deposition by sputtering) is performed on a second surface on the second processing region 5 side of the unprocessed substrate 10a held by the substrate holder 11.

Figure 17B:
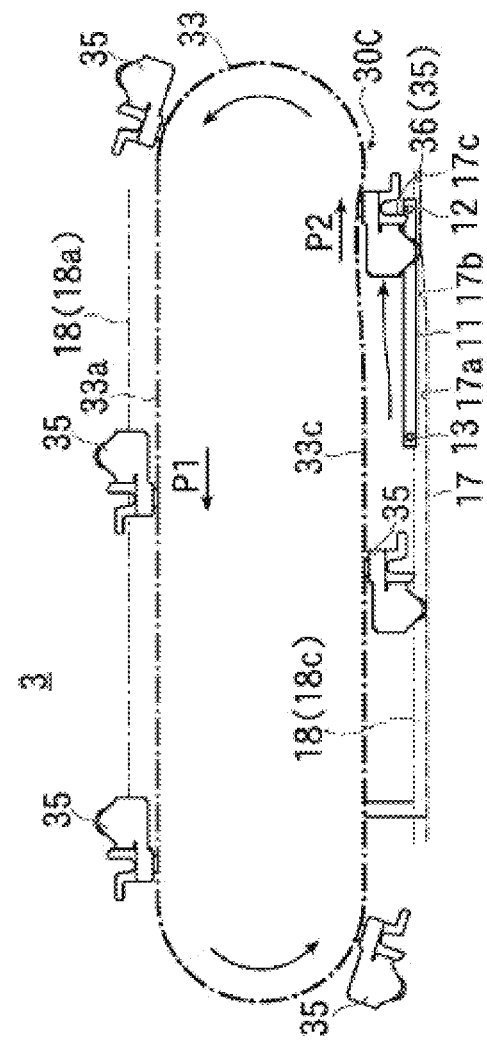

Then, when the return-path-side conveying portion 33c of the conveyance drive member 33 is caused to move in the second conveying direction P2 and the first drive unit 36 drives the first drive unit 36 in the same direction, the first drive unit 36 of the anti-sag member 35 comes out of contact with the first driven unit 12 just before the substrate holder 11 reaches the substrate holder discharge portion 30C as shown in FIG. 17B, whereby the substrate holder 11 loses its propulsive force.

FIGS. 18A-18D are each an explanatory diagram showing an operation of releasing the contact between a first drive unit of an anti-sag member and a first driven unit of a substrate holder according to this embodiment.

Figure 18A:
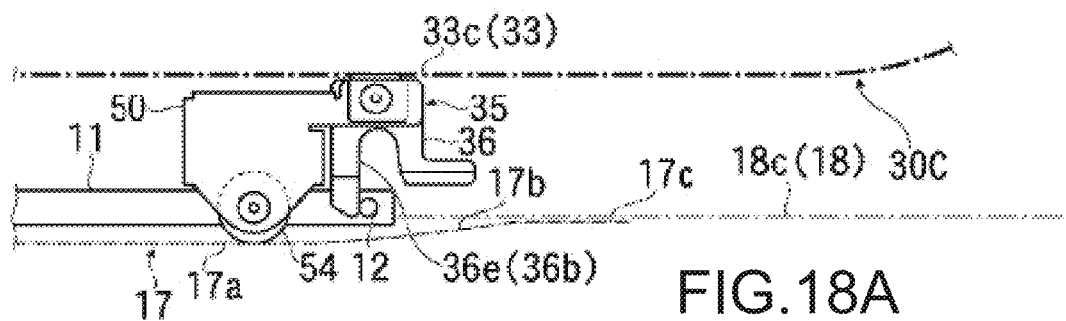
FIGS. 18A-18D are each an explanatory diagram showing an operation of releasing the contact between a first drive unit of the anti-sag member and a first driven unit of the substrate holder according to this embodiment.

When the return-path-side conveying portion 33c of the conveyance drive member 33 is caused to move in the second conveying direction P2, the substrate holder 11 is caused to move in the second conveying direction P2 while the drive surface 36e of the second protruding portion 36b of the first drive unit 36 of the anti-sag member 35 on the second conveying direction P2 side is in contact with the first driven unit 12 of the substrate holder 11 as shown in FIG. 18A.

At the position shown in FIG. 18A, the travel roller 54 of the anti-sag member 35 is in contact with the traveling portion 17a of the guide unit 17 and the anti-sag member 35 is caused to move in the horizontal direction along the traveling portion 17a.

Figure 18B:
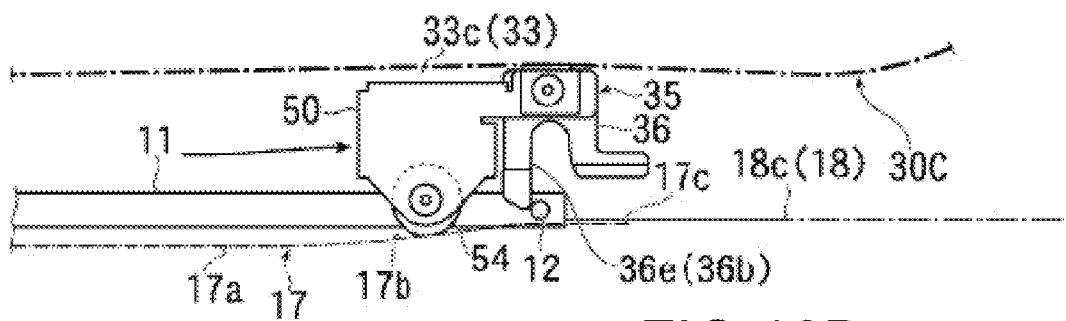

When the return-path-side conveying portion 33c of the conveyance drive member 33 is caused to move in the second conveying direction P2 in this condition, the travel roller 54 of the anti-sag member 35 rides on the upper inclined portion 17b of the guide unit 17 and moves obliquely upward in the second conveying direction P2 as shown in FIG. 18B while the substrate holder 11 is caused to move in the second conveying direction P2 on the return-side substrate holder supporting mechanism 18c, whereby the first drive unit 36 of the anti-sag member 35 is also caused to move obliquely upward in the second conveying direction P2.

Figure 18C:
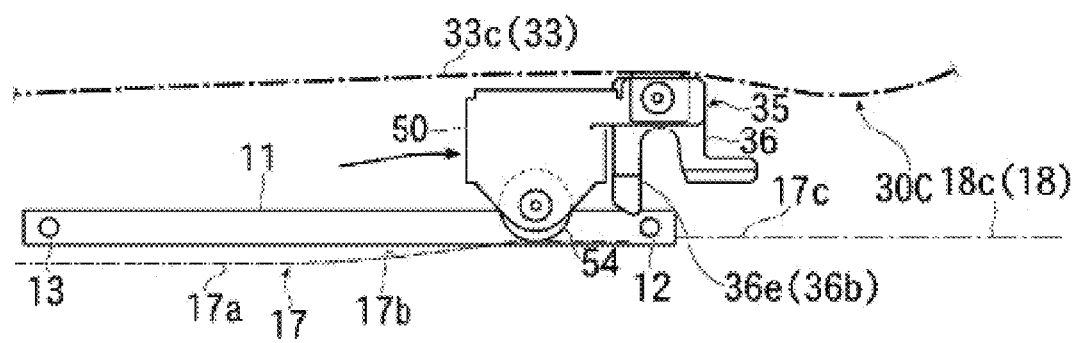

When the return-path-side conveying portion 33c of the conveyance drive member 33 is continuously caused to move in the second conveying direction P2, the height position of the first drive unit 36 of the anti-sag member 35 with respect to the first driven unit 12 of the substrate holder 11 gradually moves upward, the lower end of the second protruding portion 36b of the first drive unit 36 of the anti-sag member 35 is located above the upper part of the first driven unit 12 of the substrate holder 11 at the time point when the travel roller 54 of the anti-sag member 35 rides on the contact release portion 17c of the guide unit 17 as shown in FIG. 18C, whereby the contact of the drive surface 36e of the second protruding portion 36b of the first drive unit 36 with the first driven unit 12 of the substrate holder 11 is completely released.

Figure 18D:
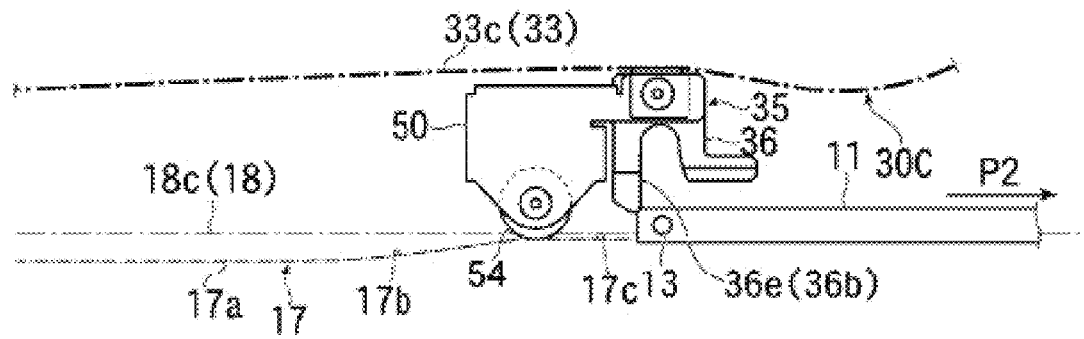

As a result, as shown in FIG. 18D, the substrate holder 11 can be caused to horizontally move in the second conveying direction P2 along the return-path-side conveying portion 33c without bringing the second protruding portion 36b of the first drive unit 36 of the anti-sag member 35 into contact with the second driven unit 13 of the substrate holder 11.

In accordance with this embodiment, it is possible to shorten the moving distance during the operation of disconnecting the first drive unit 36 of the anti-sag member 35 and the first driven unit 12 of the substrate holder 11 from each other, and shorten the operating time as compared with the existing technology (e.g., in the case where the first drive unit 36 of the anti-sag member 35 is caused to move obliquely upward along an arc-shaped locus formed by a sprocket) and thus, greatly advance the timing at which the substrate holder 11 is discharged from the substrate holder conveying mechanism 3 and delivered to the substrate carry-in/carry-out mechanism 6. Further, the second driven shaft 13 of the substrate holder 11 can also be inhibited from interfering with the tip portion of the second protruding portion 36b (the drive surface 36e) of the first drive unit 36 of the anti-sag member 35 at the time of the discharge.

Figure 19:
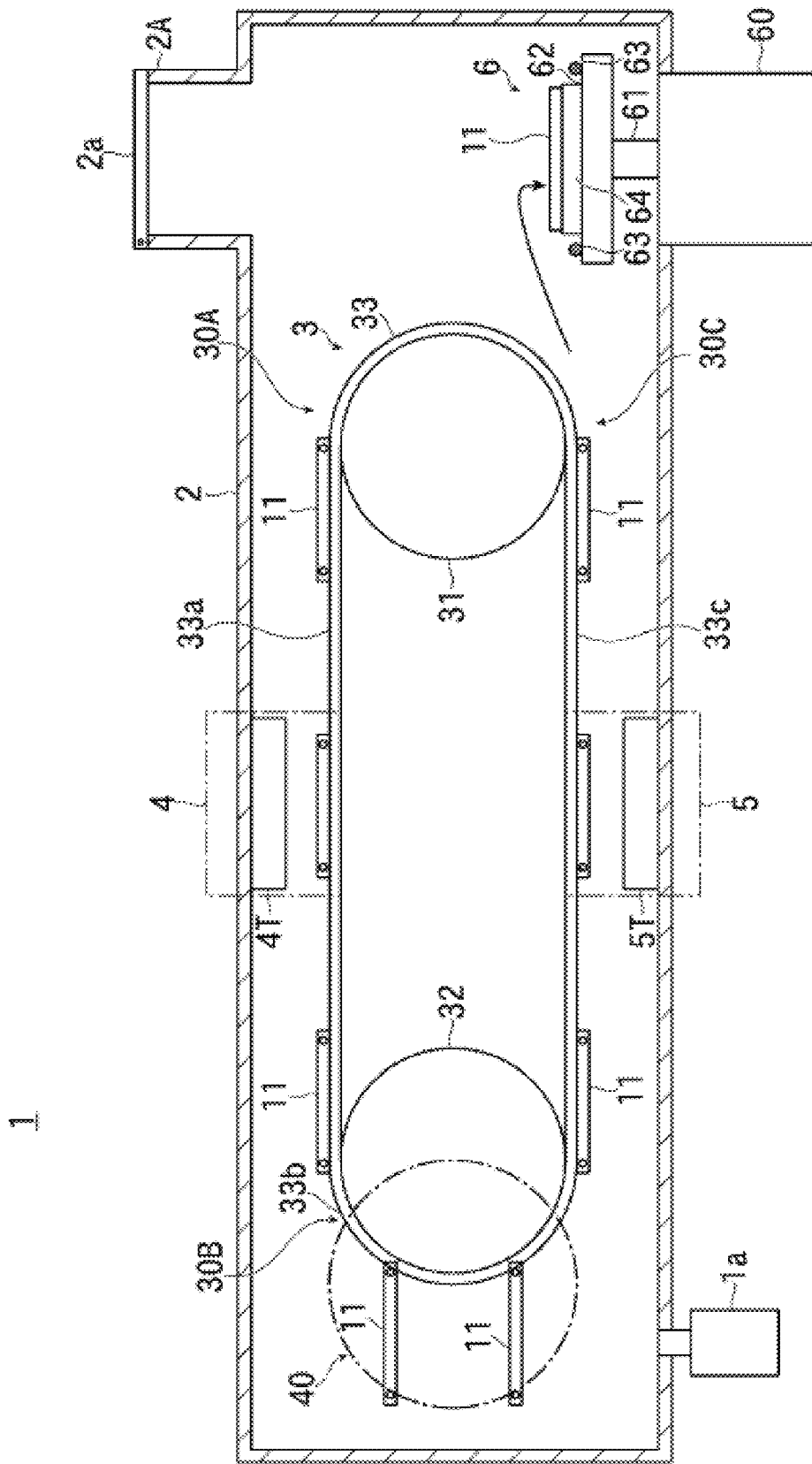
FIG. 19 is an explanatory diagram showing an operation of the vacuum processing apparatus according to this embodiment (Part 4).

After the above-mentioned operation is performed, the substrate holder 11 is caused to move in the second conveying direction P2 by the conveying robot 64 of the substrate carry-in/carry-out mechanism 6 shown in FIG. 19 to be separated from the first drive unit 36.

Further, the substrate holder 11 is taken out using the conveying robot 64 of the substrate carry-in/carry-out mechanism 6, and the substrate holder 11 is disposed on the support portion 62 together with the conveying robot 64 as shown in FIG. 19.

Figure 20:
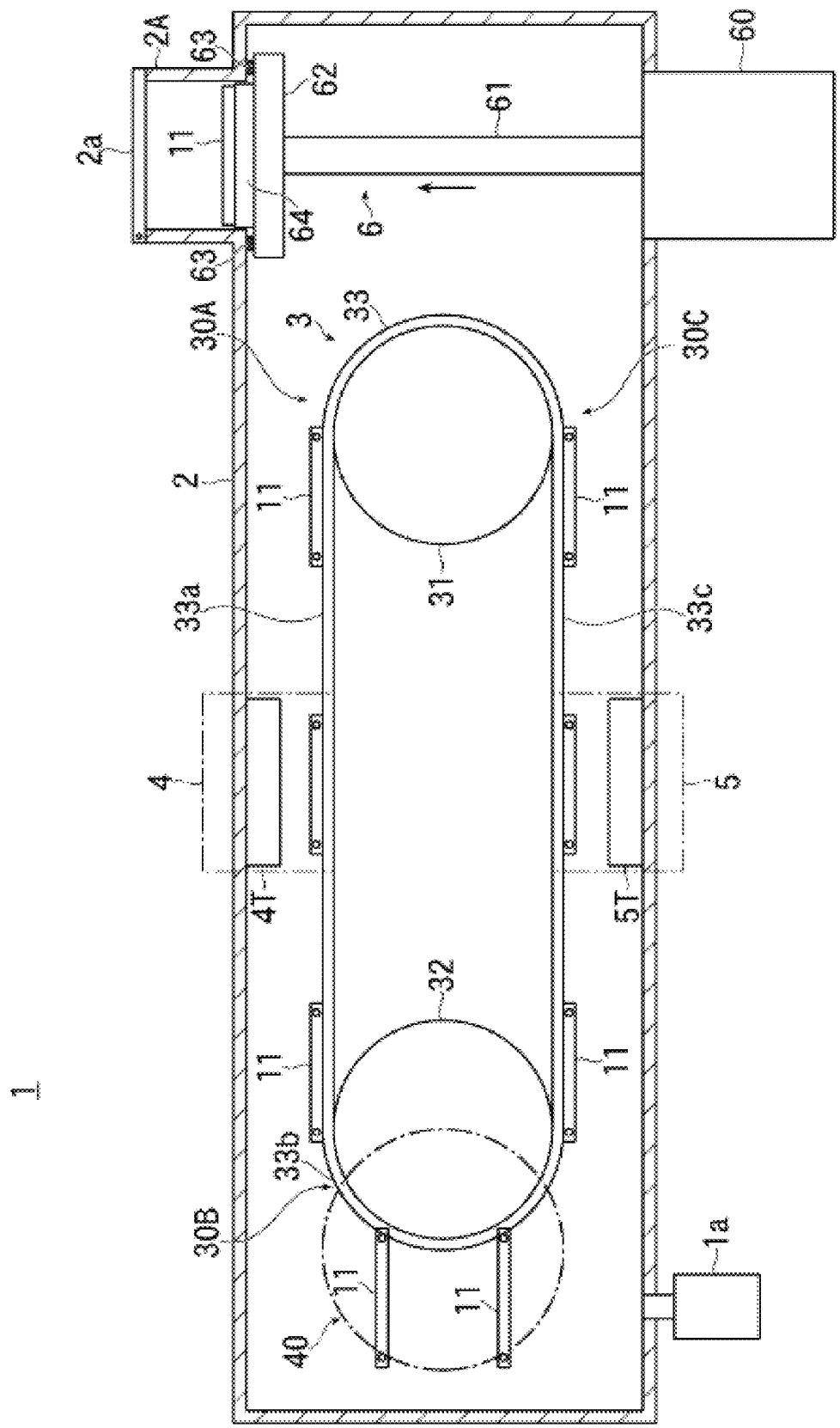
FIG. 20 is an explanatory diagram showing the operation of the vacuum processing apparatus according to this embodiment (Part 5).

After that, as shown in FIG. 20, the support portion 62 of the substrate carry-in/carry-out mechanism 6 is raised, and venting is performed to the atmospheric pressure while the seal member 63 on the support portion 62 is in close contact with the inner wall of the vacuum chamber 2 to isolate the atmosphere in the substrate carry-in/carry-out chamber 2A from the atmosphere in the vacuum chamber 2.

Figure 21:
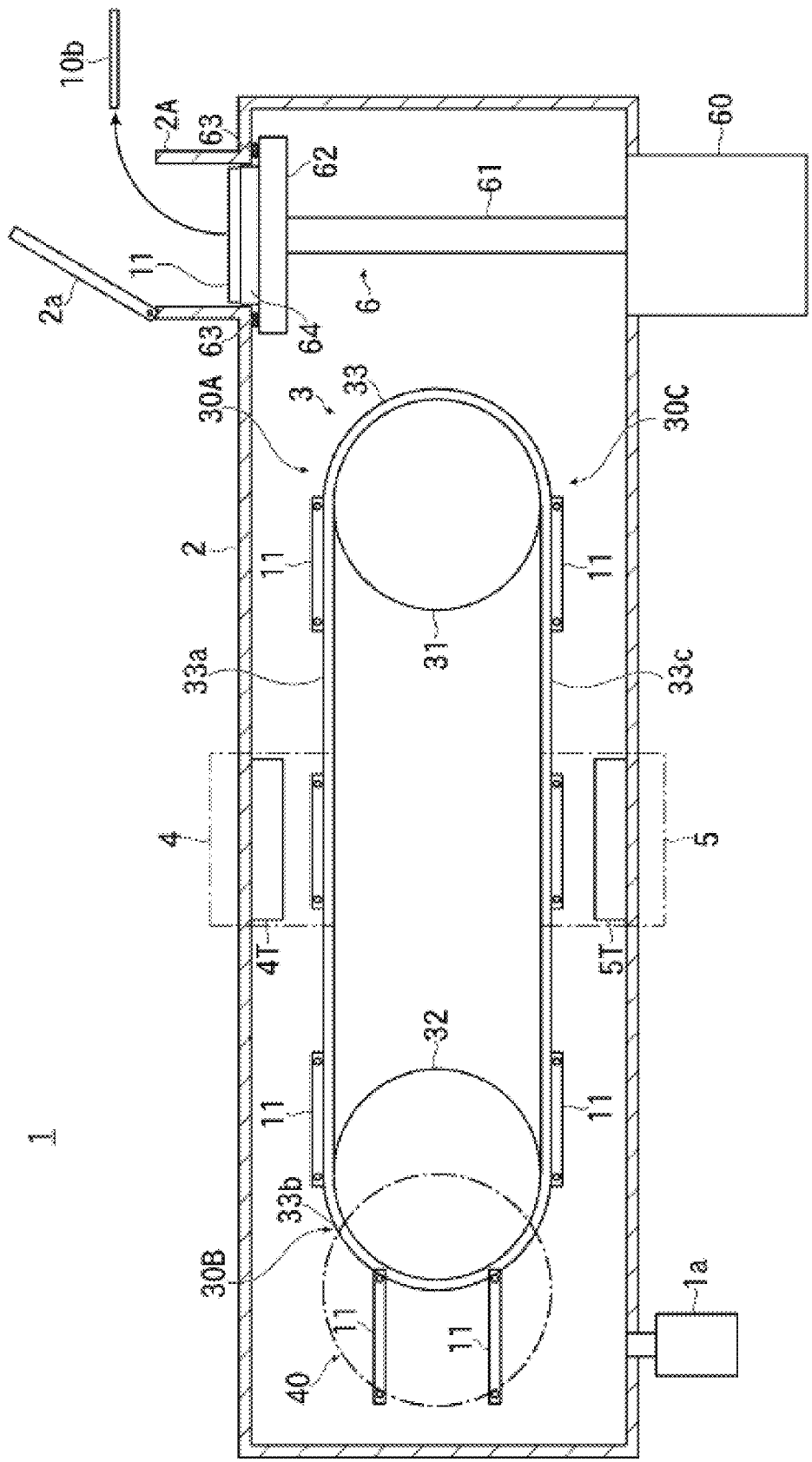
FIG. 21 is an explanatory diagram showing the operation of the vacuum processing apparatus according to this embodiment (Part 6).
Figure 22:
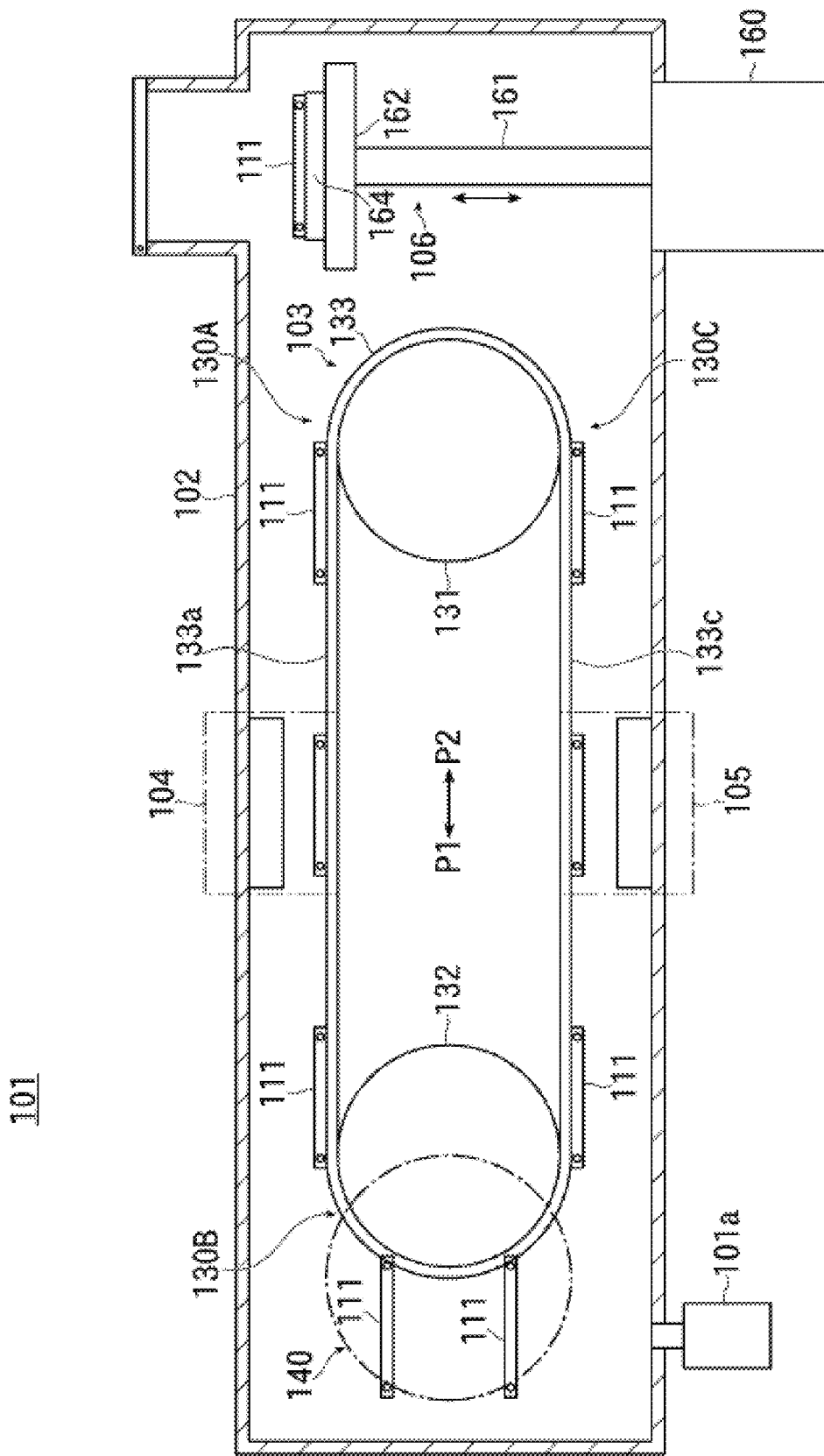
FIG. 22 is a schematic configuration diagram showing an entire vacuum processing apparatus according to an existing technology.
Figure 23:
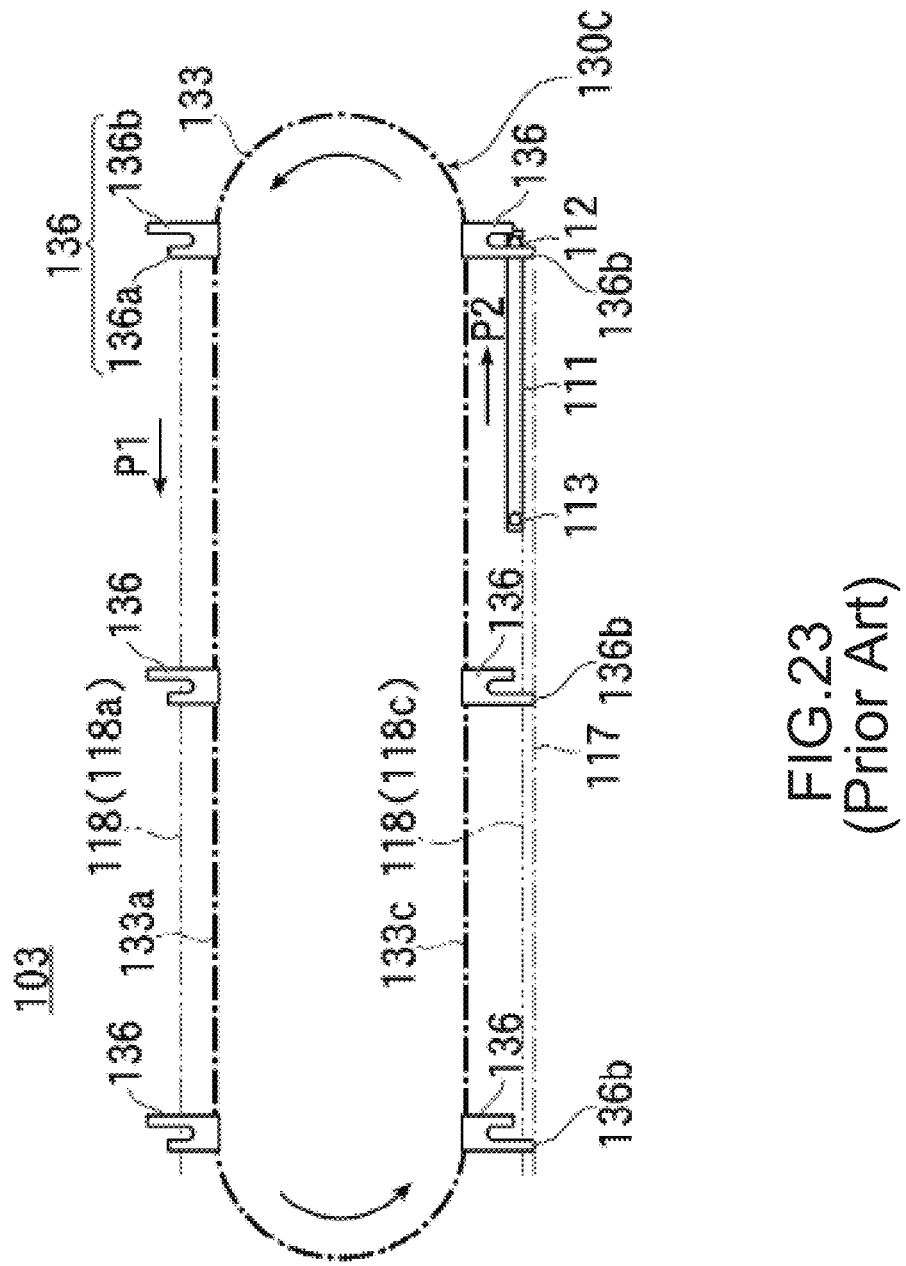
FIG. 23 is a schematic configuration diagram showing an existing substrate holder conveying mechanism.

Then, as shown in FIG. 21, the lid portion 2a of the substrate carry-in/carry-out chamber 2A is opened, and the processed substrate 10b is taken out of the substrate holder 11 into the atmosphere using a conveying robot (not shown).

After that, returning to the state shown in FIG. 11, by repeating the above-mentioned operation, the above-mentioned vacuum processing is performed on both sides of each of the plurality of substrates 10.

In the embodiment described above, since in the vacuum chamber 2 that includes a conveying path formed so that a projected shape on the vertical surface is a continuous ring shape, a single vacuum atmosphere being formed in the vacuum chamber 2, the travel roller 54 of the anti-sag member 35 assembled to the first drive unit 36 provided on the outer side with respect to the conveying direction of the conveying path travels along the guide unit 17 that is provided below the return-path-side conveying portion 33c of the conveyance drive member 33 located on the lower side of the substrate holder conveying mechanism 3 and extends in the second conveying direction P2, and the first drive unit 36 is configured to be in contact with the first driven unit 12 of the substrate holder 11 to drive the substrate holder 11 along the conveying path in the second conveying direction P2, it is possible to suppress the generation of dust at the time of conveying the substrate holder 11 as compared with the existing technology while inhibiting the return-path-side conveying portion 33c (e.g., the conveyor chain) of the conveyance drive member 33 constituting the second conveying portion of the conveying path from sagging.

Further, in this embodiment, since the substrate holder 11 is configured to hold the plurality of substrates 10 side by side in the direction perpendicular to the conveying direction, the length of a substrate holder and the surplus space associated therewith can be reduced as compared with the case where the processing is performed by conveying a substrate holder that holds a plurality of substrates side by side in the conveying direction of the substrates as in the existing technology, and therefore, it is possible to achieve further space saving of a vacuum processing apparatus.

Note that the present invention is not limited to the embodiment described above, and various modifications can be made.

For example, in the above-mentioned embodiment, the substrate holder conveying mechanism 3 and the direction change mechanism 40 include a pair of sprockets and a conveyor chain bridged over the pair of sprockets, but, for example, an annular conveying drive mechanism using a belt or rail can also be used.

Further, the substrate holder supporting mechanism 18 may be configured using a belt or a rail instead of a roller.

Further, the shape of each of the first and second drive units 36 and 46 is not limited to the above-mentioned embodiment, and various shapes can be adopted as long as it can be reliably brought into contact with the first and second driven units 12 and 13 of the substrate holder 11 and can be supported and driven.

Further, although an apparatus that performs sputtering as processing in a vacuum is exemplified in the above-mentioned embodiment, the present invention is not limited thereto. For example, the present invention can be applied to a vacuum processing apparatus that performs various types of processing such as plasma processing, ion implantation processing, vapor deposition processing, chemical vapor deposition processing, focused ion beam processing, and etching processing.

In this case, the first and second processing regions 4 and 5 may also be provided with processing sources for performing different types of processing.

Further, as in the above-mentioned embodiment, the present invention can be applied not only to the case where the unprocessed substrate 10a is carried into the vacuum chamber 2 and the processed substrate 10b is carried out of the vacuum chamber 2, but also to the case where the unprocessed substrate 10a is carried into the vacuum chamber 2 together with the substrate holder 11 and the processed substrate 10b is carried out from the vacuum chamber 2 together with the substrate holder 11.

REFERENCE SIGNS LIST 1 vacuum processing apparatus
2 vacuum chamber
3 substrate holder conveying mechanism
4 first processing region
4T sputter source
5 second processing region
5T sputter source
6 substrate carry-in/carry-out mechanism 10 substrate
11 substrate holder
12 first driven unit
13 second driven unit
17 guide unit
17a traveling portion
17b upper inclined portion
17c contact release portion
30A substrate holder introduction portion
30B conveyance turnaround portion
30C substrate holder discharge portion
31 first drive wheel
32 second drive wheel
33 conveyance drive member (conveying path)
33a outbound-side conveying portion(first conveying portion)
33b turnaround portion
33c return-path-side conveying portion (second conveying portion)
35 anti-sag member
36 first drive unit
36a first protruding portion
36b second protruding portion
36e drive surface
40 direction change mechanism
41 first guide member
42 second guide member
43 third guide member
45 conveyance drive member
46 second drive unit
51 first direction change path
52 second direction change path

The invention claimed is:

1. A vacuum processing apparatus, comprising:
a vacuum chamber comprising a region in which a single vacuum atmosphere is formed;
first and second processing regions provided in the region of the vacuum chamber, predetermined vacuum processing being performed on substrates held by a plurality of substrate holders in the first and second processing regions;
a conveying path for conveying the substrate holder; and
a substrate holder conveying mechanism provided in the vacuum chamber and conveying each of the plurality of substrate holders including first and second driven units along the conveying path,
wherein the conveying path includes a first conveying portion configured to introduce the substrate holder and convey the substrate holder in a first conveying direction along the conveying path while horizontalizing the substrate holder, a second conveying portion configured to convey the substrate holder along the conveying path in a second conveying direction opposite to the first conveying direction while horizontalizing the substrate holder and to discharge the substrate holder, and a conveyance turnaround portion configured to turn and convey the substrate holder from the first conveying portion to the second conveying portion, the first conveying portion being configured to pass through one of the first and second processing regions, the second conveying portion being configured to pass through the other of the first and second processing regions,
wherein the substrate holder conveying mechanism includes a plurality of first drive units on an outer side with respect to the first and second conveying directions, each of the plurality of first drive units being in contact with a respective first driven unit of the substrate holder to drive the substrate holder along the conveying path,
wherein a direction change mechanism including a plurality of second drive units and first and second direction change paths is provided in a vicinity of the conveyance turnaround portion of the conveying path, each of the plurality of second drive units being in contact with the a respective second driven unit of the substrate holder to drive the substrate holder along the conveying path, the first and second direction change paths being for respectively guiding and conveying the first and second driven units of the substrate holder so as to turn the substrate holder from the first conveying direction to the second conveying direction, wherein the substrate holder is delivered from the first conveying portion to the second conveying portion while maintaining a posture of the substrate holder by operating the first drive unit of the substrate holder conveying mechanism and the second drive unit of the direction change mechanism such that the first and second drive units remain in the same vertical position with each other and respectively guiding and conveying the first and second driven units of the substrate holder along the first and second direction change paths of the direction change mechanism, wherein an anti-sag member is provided to be assembled to the first drive unit of the substrate holder conveying, mechanism and includes a travel roller in a part on the outer side with respect to the first and second conveying directions, the travel roller configured to rotate about a rotation axis extending in a direction perpendicular to the first conveying direction and the second conveying direction, and the anti-sag member inhibits a conveyance drive member constituting the second conveying portion of the conveying path from sagging, wherein a guide unit is provided below the second conveying portion of the conveying path located on a lower side of the substrate holder conveying mechanism, the guide unit extending in the second conveying direction, and wherein the anti-sag member is configured so that the travel roller travels along the second conveying portion of the conveying path while the travel roller is guided and supported by the guide unit, and the first drive unit of the substrate holder conveying mechanism is in contact with the first driven unit of the substrate holder to drive the substrate holder along the conveying path in the second conveying direction.

2. The vacuum processing apparatus according to claim 1, wherein the conveyance drive member is a conveyor chain.

3. The vacuum processing apparatus according to claim 1, wherein a drive surface is provided on the first drive unit of the anti-sag member, the drive surface extending downward and being in contact with the first driven unit of the substrate holder to drive the first driven unit in the conveying direction, and wherein an upper inclined portion is provided in the guide unit, the upper inclined portion being formed to extend obliquely upward toward the second conveying direction.

4. The vacuum processing apparatus according to claim 1, wherein deposition is performed in the first and second processing regions.

5. The vacuum processing apparatus according to claim 1, wherein the substrate holder is configured to hold a plurality of substrates to be deposited side by side in the direction perpendicular to the first conveying direction and second conveying directions.

* * * * *